(12) United States Patent
Orii et al.

(10) Patent No.: US 7,862,680 B2
(45) Date of Patent: Jan. 4, 2011

(54) SUBSTRATE PROCESSING APPARATUS

(75) Inventors: Takehiko Orii, Nirasaki (JP); Tatsuya Nishida, Tosu (JP); Osamu Kuroda, Tosu (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/149,829

(22) Filed: May 8, 2008

(65) Prior Publication Data

US 2008/0210278 A1  Sep. 4, 2008

Related U.S. Application Data

(62) Division of application No. 11/356,364, filed on Feb. 17, 2006, which is a division of application No. 10/209,617, filed on Aug. 1, 2002, now Pat. No. 7,332,055.

(30) Foreign Application Priority Data

Aug. 2, 2001 (JP) ............................. 2001-234836

(51) Int. Cl.
  *H01L 21/027* (2006.01)
  *H01L 21/304* (2006.01)
  *B08B 3/02* (2006.01)

(52) U.S. Cl. ..................... 156/345.21; 156/345.17; 134/198

(58) Field of Classification Search ............ 156/345.21, 156/345.17; 134/198
See application file for complete search history.

(56) References Cited

U.S. PATENT DOCUMENTS

| 5,415,691 | A |  | 5/1995 | Fujiyama et al. |
| 5,575,079 | A |  | 11/1996 | Yokomizo et al. |
| 5,608,943 | A |  | 3/1997 | Konishi et al. |
| 5,671,544 | A |  | 9/1997 | Yokomizo et al. |
| 5,772,764 | A | * | 6/1998 | Akimoto ............ 118/319 |
| 5,939,139 | A |  | 8/1999 | Fujimoto |
| 6,106,618 | A |  | 8/2000 | Gilmer et al. |
| 6,136,163 | A |  | 10/2000 | Cheung et al. |
| 6,210,481 | B1 | * | 4/2001 | Sakai et al. ............ 118/697 |
| 6,225,235 | B1 |  | 5/2001 | Kunze-Concewitz |

(Continued)

FOREIGN PATENT DOCUMENTS

EP  0 368 334 A2  5/1990

(Continued)

OTHER PUBLICATIONS

Machine generated translation of JP 2000-133625. Published May 12, 2000.*

(Continued)

*Primary Examiner*—Sylvia R. MacArthur
(74) *Attorney, Agent, or Firm*—Smith, Gambrell & Russell, LLP

(57) ABSTRACT

A substrate processing apparatus is provided. The apparatus includes a plurality of fluid suppliers 61, 61, 63 for supplying different processing fluids. In processing a wafer W, the substrate processing apparatus moves the fluid suppliers 61, 62, 63 along the peripheral part of the wafer W relatively. The fluid suppliers 61, 62, 63 are arranged in a direction extending from the circumference of the wafer W to its inside. With the arrangement, the apparatus is capable of stable processing of the wafer W in spite of rotating the wafer W at a low speed. Further, it is possible to improve a throughput of the apparatus in resist processing.

9 Claims, 14 Drawing Sheets

U.S. PATENT DOCUMENTS

| | | |
|---|---|---|
| 6,287,390 B2 | 9/2001 | Sakai et al. |
| 6,315,836 B1 | 11/2001 | Oka et al. |
| 6,379,235 B1 | 4/2002 | Halley |
| 6,385,805 B2 | 5/2002 | Konishi et al. |
| 6,431,190 B1 | 8/2002 | Oka et al. |
| 6,491,764 B2 | 12/2002 | Mertens et al. |
| 6,533,864 B1 | 3/2003 | Matsuyama et al. |
| 6,566,275 B1 | 5/2003 | Moon |
| 6,585,876 B2 | 7/2003 | Dordi et al. |
| 6,627,263 B2 | 9/2003 | Kitano et al. |
| 6,669,809 B2 | 12/2003 | Hashimoto et al. |
| 6,683,007 B1 | 1/2004 | Yamasaki et al. |
| 6,688,784 B1 | 2/2004 | Templeton |
| 6,730,599 B2 | 5/2004 | Inada et al. |
| 6,810,888 B2 | 11/2004 | Tsuchiya et al. |
| 6,932,884 B2 | 8/2005 | Saito et al. |
| 2001/0017191 A1 | 8/2001 | Hashimoto et al. |
| 2001/0037858 A1 | 11/2001 | Taniyama et al. |
| 2003/0199229 A1 | 10/2003 | Vereen et al. |

FOREIGN PATENT DOCUMENTS

| | | |
|---|---|---|
| EP | 0 677 867 A2 | 10/1995 |
| JP | 2-94435 | 4/1990 |
| JP | 06-208948 | 7/1994 |
| JP | 07-106240 | 4/1995 |
| JP | 7-176509 | 7/1995 |
| JP | 08-130202 | 5/1996 |
| JP | 09-330904 | 12/1997 |
| JP | 10-229062 | 8/1998 |
| JP | 10-303101 | 11/1998 |
| JP | 10-303169 | 11/1998 |
| JP | 10-314686 | 12/1998 |
| JP | 11-87294 A | 3/1999 |
| JP | 11-102884 | 4/1999 |
| JP | 11176795 A * | 7/1999 |
| JP | 11-329955 | 11/1999 |
| JP | 2000-84503 | 3/2000 |
| JP | 2000-133625 | 5/2000 |
| JP | 2001-53051 | 2/2001 |
| JP | 2001-149843 | 6/2001 |
| JP | 2001-156032 | 6/2001 |
| JP | 3248970 | 11/2001 |
| JP | 2002-110626 | 4/2002 |
| JP | 2002176020 A * | 6/2002 |

OTHER PUBLICATIONS

Machine generated translation of JP 2002-176020. Published Jun. 21, 2002.*

Machine generated translation of JP 11-176795. Published Jul. 2, 1999.*

Machine generated translation of JP 2002-075953. Published Mar. 15, 2002.*

Japanese Office Action issued on Feb. 17, 2010 for Japanese Patent Application No. 2006-300391 with English translation.

* cited by examiner

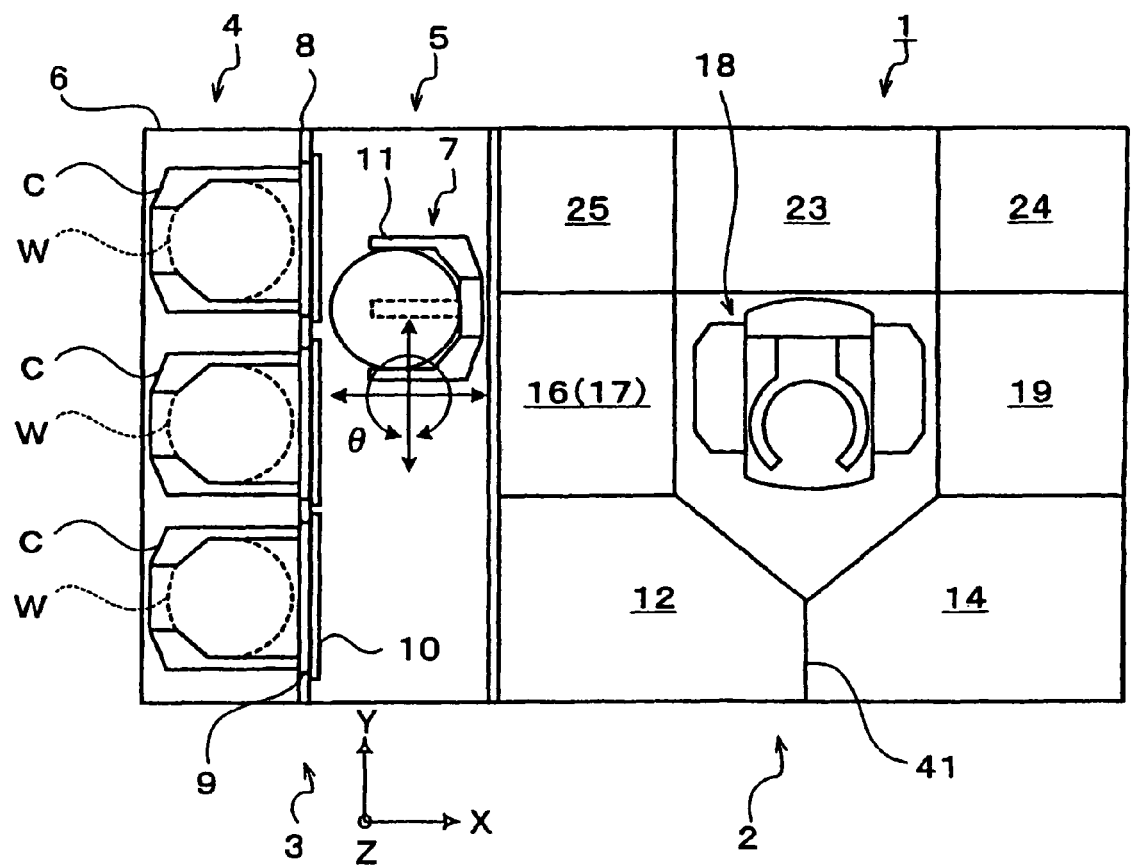
F I G. 1

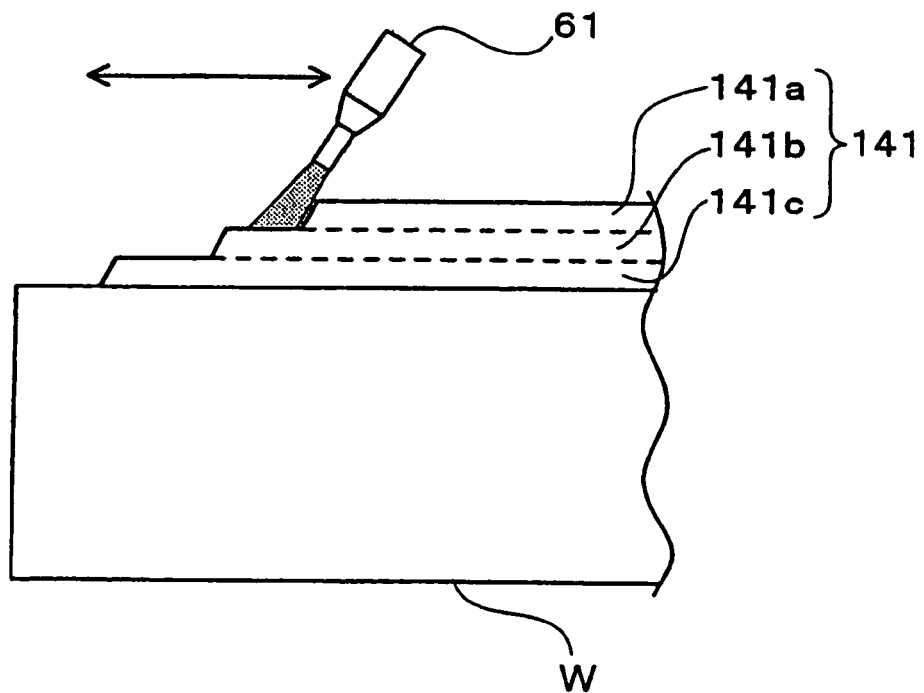
F I G. 20
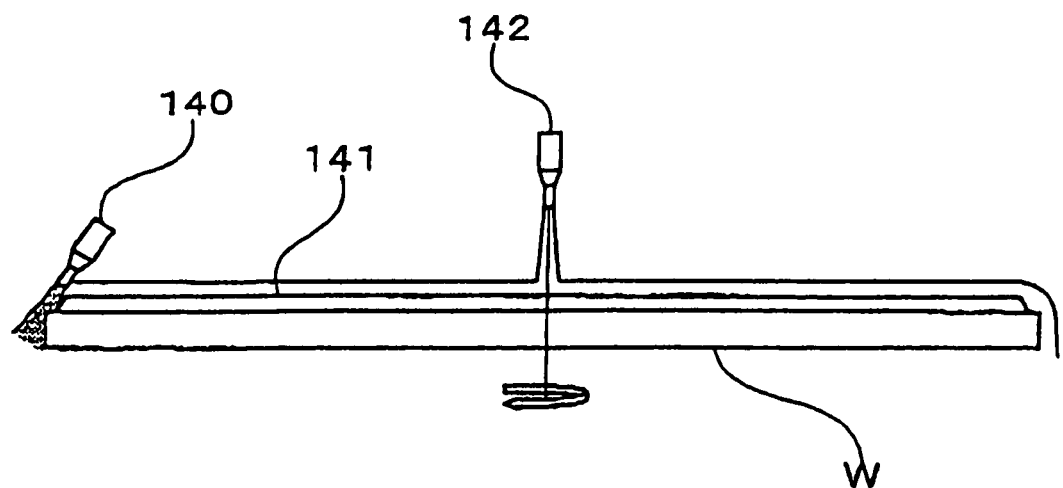
F I G. 21

SUBSTRATE PROCESSING APPARATUS

CROSS REFERENCE TO RELATED APPLICATIONS

This application is a division of Ser. No. 11/356,364 filed Feb. 17, 2006, which is a division of Ser. No. 10/209,617, filed Aug. 1, 2002 now U.S. Pat. No. 7,332,055, both being incorporated in their entirety herein by reference.

BACKGROUND OF THE INVENTION

1. Technical Field of the Invention

This invention relates to substrate processing apparatus for processing substrates, for example, semiconductor wafers, glass substrates for LCD, etc.

2. Description of the Related Art

In the manufacturing process for semiconductor devices, there exists a problem that when a semiconductor wafer (referred as "wafer", hereinafter) has a metallic film laminated thereon, the metallic film is easy to separate from the peripheral part of the wafer. If such a separation originates in the peripheral part of the wafer, the separation may spread gradually to extend over an area where a semiconductor device is to be built. In order to prevent the occurrence of the above phenomenon, there has been attempted a step of removing a metallic film (part) formed on the peripheral part of the wafer in advance. Note, this removal step will be referred "peripheral-part removing process", hereinafter. FIG. 21 is an explanatory view of a method of carrying out the peripheral-part removing process by using the conventional substrate processing apparatus. According to the method, a wafer W is rotated by a holder. While rotating the wafer W, a processing liquid is supplied to the peripheral part of the wafer W through a liquid supplier 140, such as nozzle, thereby to eliminate the circumferential corner of a metallic film 141 obliquely. On the other hand, through a supply unit 142 arranged above the center of the wafer W, pure water is supplied to the wafer W in order to prevent the processing liquid from adhering to the other wafer portion except an objective area to be supplied with the processing liquid and also order to sweep away the processing liquid toward the circumference of the wafer.

In order to produce enough centrifugal force to sweep away the processing liquid toward the circumference of the wafer, however, it has been required that the substrate processing apparatus can rotate the wafer at considerable high-speed revolutions. Additionally, as the pure water is supplied to the whole wafer in spite of processing the peripheral part of the wafer only, the whole wafer has to be dried throughout. Therefore, these requirements incur a deterioration in the throughput of the substrate processing apparatus in processing the wafers.

SUMMARY OF THE INVENTION

Under such a circumference as mentioned above, an object of the present invention is to provide substrate processing apparatus which is capable of stable processing in spite of rotating the substrate at a low speed and also capable of improving the above throughput.

In order to attain the above object, according to the first feature of the present invention, there is provided a substrate processing apparatus for processing a substrate, comprising:
a plurality of fluid suppliers arranged apart from each other in the vicinity of the peripheral part of the substrate and adapted so as to supply the substrate with difference processing fluids, the fluid suppliers being arranged in one line extending from the circumference of the substrate toward an inside thereof;
wherein the processing fluids are supplied from the plural fluid suppliers to the peripheral part of the substrate while rotating the substrate thereby to allow the plurality of fluid suppliers to move along the circumference of the substrate relatively. According to this substrate processing apparatus, the processing fluid supplied from the inside fluid supplier (in the radial direction of the substrate) allows the other processing fluid, such as chemical liquid, supplied from the outside fluid supplier to be swept away in a direction apart from the center of the substrate.

According to the second feature of the invention, a top plate is arranged above the substrate so as to oppose the substrate. The top plate is relatively movable between a position adjacent to the top face of the substrate and a position apart from the top face of the substrate. For example, at processing, if moving the top plate to a position close to the upper face of the substrate thereby to cover a substrate's surface requiring no processing, then it becomes possible to prevent the processing fluid from splashing onto the above substrate's surface requiring no processing.

According to the third feature of the invention, the top plate has a diameter smaller than a diameter of the substrate.

According to the fourth feature of the invention, the top plate is adapted so as to eject inert gas between the top plate and the substrate.

According to the fifth feature of the invention, the top plate is rotatable.

According to the sixth feature of the invention, the top plate is provided, on a peripheral part thereof, with a recess for receiving the plural fluid suppliers therein. For example, at processing, if the plural fluid suppliers supply the processing fluids while being received in the recess, the top plate can cover the other surface on the substrate.

According to the seventh feature of the invention, an under plate is arranged below the substrate. The under plate is movable up and down and arranged so as to oppose the substrate.

According to the eighth feature of the invention, the under plate has a port formed to supply a cleaning liquid for cleaning the substrate.

According to the ninth feature of the invention, the plural fluid suppliers are movable in relation to the substrate along a direction to arrange the fluid suppliers.

According to the tenth feature of the invention, the substrate processing apparatus further comprises an outer chamber which is arranged so as to surround the substrate and the plural fluid suppliers are movable between an inside of the outer chamber and the outside.

According to the eleventh feature of the invention, the substrate processing apparatus further comprises a supplier housing which is arranged outside the outer chamber to house the plural fluid suppliers therein.

According to the twelfth feature of the invention, the plural fluid suppliers are controlled in operation so that an inside fluid supplier of the fluid suppliers supplies the processing fluid in advance of the supply of the processing fluid by an outside fluid supplier of the fluid suppliers, the inside fluid supplier being closer to the center of the substrate than the outside fluid supplier.

According to the thirteenth feature of the invention, an outermost fluid supplier of the plural fluid suppliers is adapted so as to supply the substrate with a chemical liquid, while an innermost fluid supplier of the plural fluid suppliers is adapted so as to supply the substrate with an inert processing fluid.

According to the fourteenth feature of the invention, the inert processing fluid is a nitrogen gas, a pure water flowing between the chemical liquid and the nitrogen gas.

In this case, since the innermost fluid supplier does not process the substrate, the pure water can sweep away a processing liquid supplied to the peripheral part of the substrate without processing the center surface of the substrate.

According to the fifteenth feature of the invention, the chemical liquid is a liquid for removing a metallic film formed on the substrate.

According to the sixteenth feature of the invention, the processing fluid supplied from an exterior one of the plural fluid suppliers is supplied in a flowing area where the processing fluid supplied from an interior one of the plural fluid suppliers is flowing on the surface of the substrate. Then, by the processing fluid supplied from the inside fluid supplier (in the radial direction of the substrate), it is possible to prevent the other processing fluid supplied from the outside fluid supplier from flowing outside of a substrate's surface (area) where the processing fluid from the inside fluid supplier is flowing on.

According to the seventeenth feature of the invention, the plural fluid suppliers are provided with a common cover plate for preventing the processing fluids ejected from the fluid suppliers from splashing to the center side of the substrate.

According to the eighteenth feature of the invention, the substrate processing apparatus further comprises an annular cover which is arranged in the circumference of the substrate to receive the processing fluids which has been supplied to the substrate in rotation and subsequently splashed due to resultant centrifugal force.

According to the nineteenth feature of the invention, the processing of the substrate is carried out in multistage in accordance with a distance from the periphery of the substrate.

According to the twentieth feature of the invention, the top plate is arranged above the substrate so as to oppose the substrate, wherein the top plate is relatively movable between a position adjacent to the top face of the substrate and a position apart from the top face of the substrate, the top plate being adapted so as to eject inert gas between the top plate and the substrate, wherein the plural fluid suppliers are movable in relation to the substrate along a direction to arrange the fluid suppliers.

According to the twenty-first feature of the invention, the under plate is arranged below the substrate so as to oppose the substrate and is movable up and down, the under plate having a port formed to supply a cleaning liquid for cleaning the substrate.

According to the present invention, there is also provided a substrate processing method of relatively moving a plurality of fluid suppliers arranged in one line extending from the circumference of the substrate toward an inside thereof and supplying the peripheral part of the substrate with different processing fluids from the plural fluid suppliers thereby processing the substrate. This method is characterized in that the processing fluid supplied by the inside fluid supplier sweeps away the other processing fluid supplied by the outside fluid supplier in a direction apart from the center of the substrate.

In the plural fluid suppliers, preferably, the outermost fluid supplier is adapted so as to supply the substrate with a chemical liquid, while the innermost fluid supplier is adapted so as to supply the substrate with an inert processing fluid. Additionally, the innermost fluid supplier may supply the substrate with pure water.

In the above substrate processing method, it is desirable that the plural fluid suppliers are controlled in operation so that the inside fluid supplier supplies the processing fluid in advance of the supply of the processing fluid by the outside fluid supplier. Note, the inside fluid supplier is arranged closer to the center of the substrate than the outside fluid supplier.

Further, it is preferable to move the plural fluid suppliers along a direction to arrange the fluid suppliers. Then, it becomes possible to change a width of each processed area on the substrate. Further, in moving the plural fluid suppliers, it is desirable that the processing of the substrate using the different processing fluids is carried out in multistage in accordance with a distance from the periphery of the substrate.

BRIEF DESCRIPTION OF THE DRAWINGS

FIG. 1 is a plan view of a substrate processing system;

FIG. 20 is an explanatory view of a process of removing the peripheral part of the wafer in accordance with another embodiment of the invention; and FIG. 21 is an explanatory view of a process of removing the peripheral part of the wafer in the substrate processing apparatus.

DESCRIPTION OF THE PREFERRED EMBODIMENT

Figure 2:
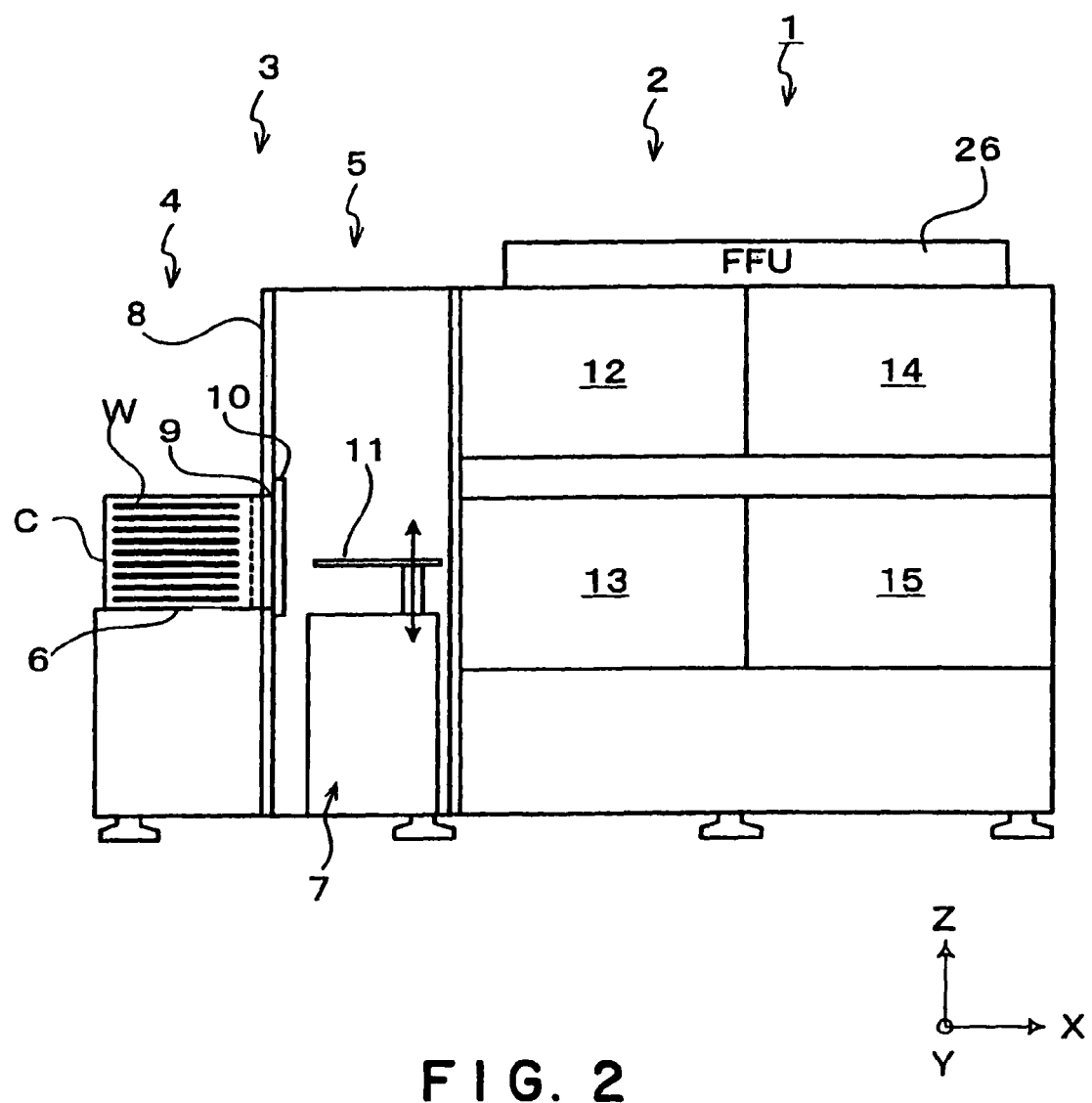
FIG. 2 is a side view of the substrate processing system.

Based on a substrate processing unit (as the substrate processing apparatus) which is constructed so as to clean the peripheral part of a wafer (as the substrate) and its back face, one preferred embodiment of the present invention will be described below. In the following descriptions, a word "cleaning process" contains a cleaning operation to eliminate a film deposited on a substrate. FIG. 1 is a plan view of the cleaning system 1 having built-in substrate processing units 12, 13 of the embodiment. FIG. 2 is a side view of FIG. 1. The cleaning system 1 includes a cleaning part 2 for carrying out cleaning process for wafers W and sequent heat treatment after cleaning and a loading/unloading part 3 for loading and unloading the wafers W to and from the cleaning part 2.

The loading/unloading part 3 is formed by an in/out port 4 provided with a mounting table 6 for mounting a container (carrier C) thereon and a wafer-transfer part 5 equipped with a wafer transfer unit 7 for carrying out the delivery of wafer between the carrier C mounted on the mounting table 6 and a cleaning part 2. The carrier C is capable of accommodating a plurality of wafers W (for example, twenty-five wafers) generally horizontally, at predetermined intervals.

The wafers W are loaded or unloaded through one side face of the carrier C. The carrier C is provided, on the side face, with a lid body that can open and shut the carrier. The carrier C has a plurality of shelf plates formed on its inner wall to retain the wafers W thereon at predetermined intervals, providing twenty-five slots for accommodating the wafers therein. While positioning the wafers' surfaces (i.e. surfaces for forming semiconductor devices) so as to face upward, the wafers W are accommodated in the slots, one by one.

The mounting table 6 of the in/out port 4 is capable of mounting e.g. three carriers C juxtaposed in a direction Y on the horizontal plane of the table, at predetermined positions. The carriers C are mounted on the table 6 so that their side faces having the lid bodies face a boundary wall 8 between the in/out port 4 and the wafer transfer part 5. The boundary wall 8 is provided, at positions corresponding to the mounting positions of the carriers C, with windows 9. On each window's side facing the wafer transfer part 5, there is arranged a window opening mechanism 10 that opens and closes the corresponding window 9 by means of a shutter etc.

This window opening mechanism 10 is also capable of opening and closing the lid body of the carrier C. The window opening mechanism 10 opens or closes the lid body of the carrier C at the same time of opening or closing the window 9. Preferably, the window opening mechanism 10 is provided with an interlocking unit that prohibits the mechanism from operating when the carrier C is not arranged at a designated position on the mounting table. When the window 9 is opened to communicate the loading/unloading port of the carrier C with the wafer transfer part 5, it becomes possible for the wafer transfer unit 7 in the wafer transfer part 5 to gain access to the carrier C, allowing of the transportation of the wafer W. On the top of the window 9, a not-shown wafer detecting device is arranged to detect the number of wafers W accommodated in the carrier C and also their conditions every slot. Alternatively, the wafer detecting device may be equipped with the window opening mechanism 10.

The wafer transfer unit 7 in the wafer transfer part 5 is movable in both Y-direction and Z-direction and also rotatable in a plane of X-Y (è-direction). The wafer transfer unit 7 includes a pickup/accommodating arm 11 for grasping the wafer W. The pickup/accommodating arm 11 is slidable in a direction of X. In this way, the wafer transfer unit 7 can obtain access to a slot at any height of all the carriers C mounted on the mounting table 6 and also access to two upper and lower wafer delivery units 16, 17 arranged in the cleaning part 2, allowing the wafer W to be transferred from the in/out port 4 to the cleaning part 2, and vice versa.

The cleaning part 2 includes a main wafer transfer unit 18, two wafer delivery units 16, 17, two substrate processing units 12, 13 of this embodiment, substrate cleaning units 14, 15, three heating units 19, 20, 21 for heating the wafers W to dry them and a cooling unit 22 for cooling the heated wafers W. The main wafer transfer unit 18 is arranged to give access to all of the wafer delivery units 16, 17, the substrate processing units 12, 13, the substrate cleaning units 14, 15, the heating units 19, 20, 21 and also the cooling unit 22. In order to accomplish the delivery of the wafers W between the wafer transfer part 5 and the wafer delivery units 16, 17, the wafers W are temporarily mounted on the units 16, 17.

In the cleaning part 2, there are arranged a battery unit 23 as a power source for working the whole cleaning system 1, a mechanical control unit 24 for controlling the operations of various sorts of devices in the cleaning system 1 and also the operation of the system 1 as a whole and a chemical storage unit 24 for storing designated cleaning liquids to be supplied to the substrate processing units 12, 13 and also the substrate cleaning units 14, 15. The battery unit 23 is connected with a not-shown main power source. On the ceiling part of the cleaning part 2, a fan filter unit (FFU) 26 is arranged to supply the above units and the main wafer transfer unit 18 with downward-flowing fresh air.

By either arranging the battery unit 23, the chemical storage unit 25 and the mechanical control unit 24 outside the cleaning part 2 or withdrawing these units 23, 24, 25 from the part 2, the arrangement facilitates maintenance of the wafer delivery units 16, 17, the main wafer transfer unit 18, the heating units 19, 20, 21 and also the cooling unit 22, from this plane (Y-direction).

Figure 3:
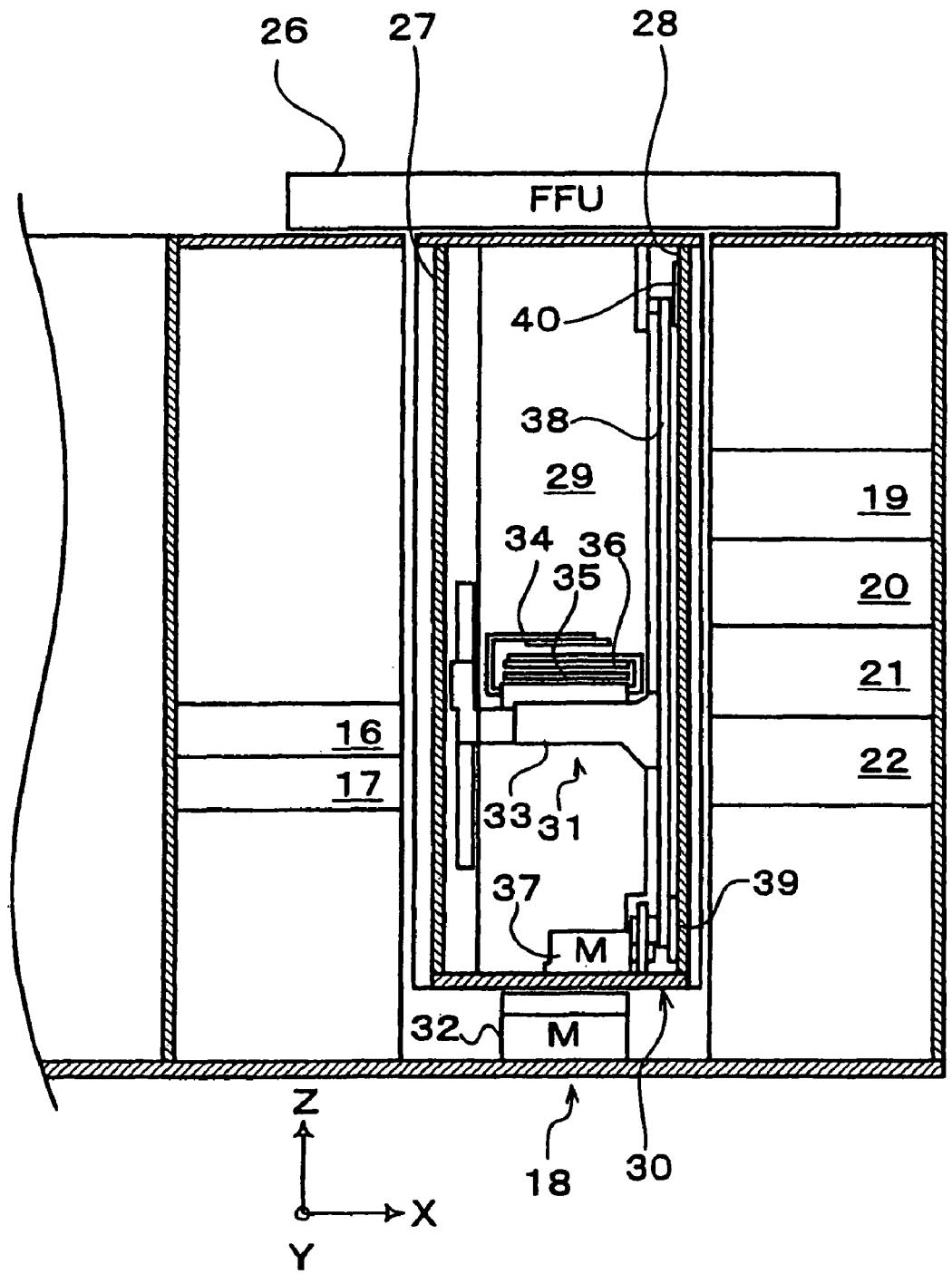
FIG. 3 is a sectional showing the schematic arrangement of a wafer delivery unit, a main wafer transfer device, a heating unit and a cooling unit all forming the substrate processing system.

FIG. 3 is a sectional view showing the schematic arrangement of the wafer delivery units 16, 17, the main wafer transfer unit 18 adjacent to the units 16, 17 in the direction X, the heating units 19, 20, 21 and the cooling unit 22. The wafer delivery units 16, 17 are stacked up in two stages up and down. For example, the wafer delivery unit 17 on the lower stage is used to mount the wafer W transferred from the in/out port 4 to the cleaning part 2, while the wafer delivery unit 16 on the upper stage is used to mount the wafer W transferred from the cleaning part 2 to the in/out port 4.

The down ward flow from the fan filter unit (FFU) 26 partially passes through the wafer delivery units 16, 17 and also their upside space and flows into the wafer transfer part 5. Consequently, it is possible to prevent particles etc. from invading the cleaning part 2 through the wafer transfer part 2, thereby maintaining the cleanness in the cleaning part 2.

The main wafer transfer unit 7 includes a cylindrical holder 30 extending in the direction of Z and having vertical walls 27, 28 and a lateral opening 29 there between and a wafer transfer body 31 disposed in the holder 30 so as to move up and down in the direction of Z. The cylindrical holder 30 is rotatable owing to the rotational driving force of a motor 32 and correspondingly, the wafer transfer body 31 is rotated in a body with the holder 30.

The wafer transfer body 31 is equipped with a transfer base 33 and three transfer arms 34, 35, 36 movable in front and in the rear along the transfer base 33. The transfer arms 34, 35, 36 are formed with dimensions allowing the arms to pass through the lateral opening 29 of the cylindrical holder 30. These transfer arms 34, 35, 36 are adapted so as to move independently of each other owing to a motor and a belt mechanism both provided in the transfer base 33. When a belt 38 is driven by a motor 37, the wafer transfer body 31 can move up and down. Note, reference numeral 39 denotes a driving pulley, while reference numeral 40 denotes a driven pulley.

On the cooling unit 22 for cooling the wafer W by force, the heating units 19, 20, 21 are piled up one after another. Alternatively, there may be arranged the cooling unit 22 and the heating units 19, 20, 21 in a space defined above the wafer delivery units 16, 17. Then, it becomes possible to divert respective spaces occupied by the cooling unit 22 and the heating units 19, 20, 21 to another utility space.

The substrate processing units 12, 13 are arranged in two stages vertically. The substrate processing units 12, 13 are capable of cleaning of the back face of the wafer W, removal of the peripheral part of the surface of the wafer W and also cleaning of the surface of the wafer W (Back-Bevel cleaning). The substrate processing units 12, 13 are provided with structures similar to each other. Therefore, the detailed structures will be described below, by example of the substrate processing unit 12.

Figure 4:
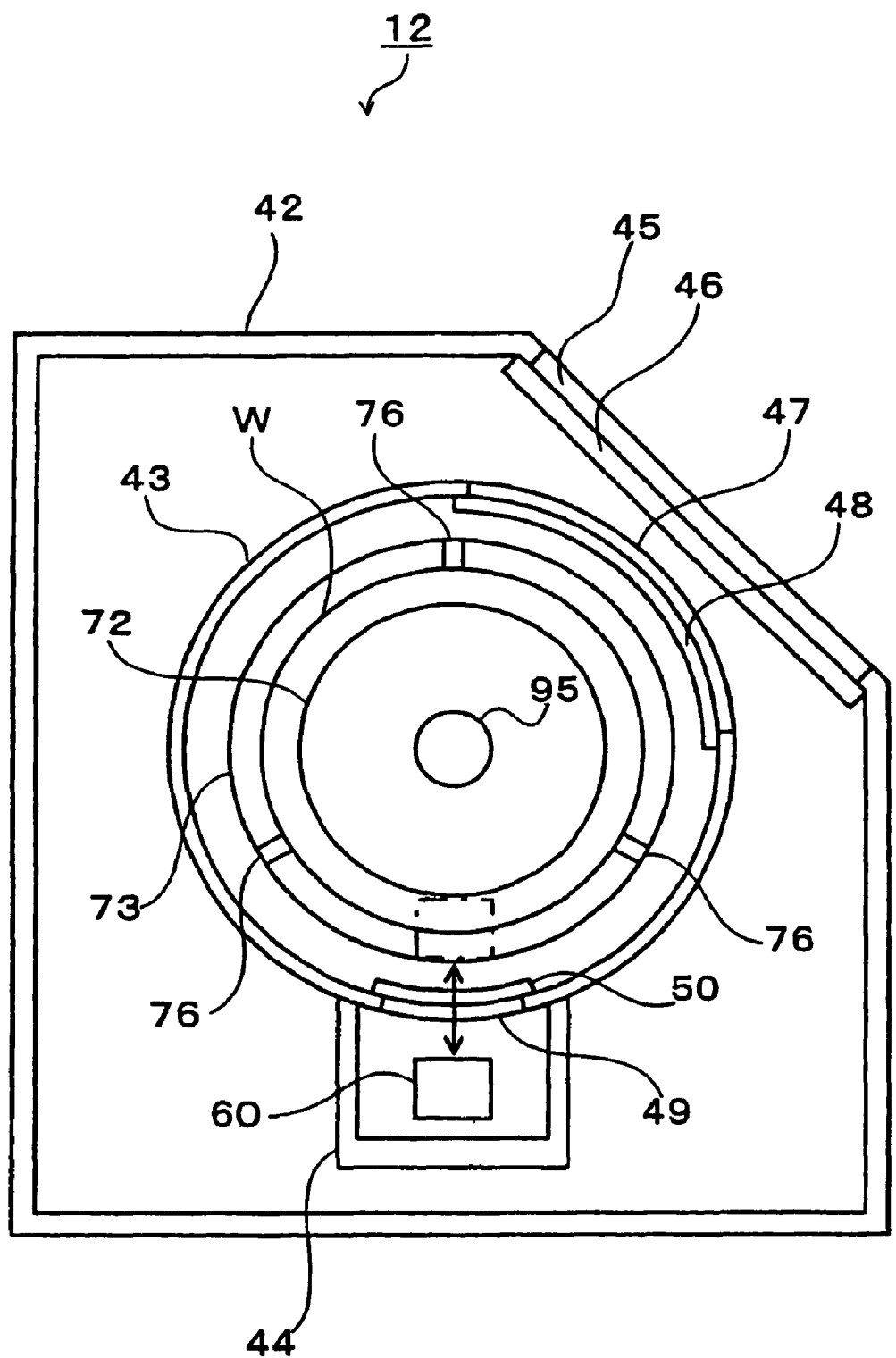
FIG. 4 is a plan view of a substrate processing unit of an embodiment of the present invention.

FIG. 4 is a plan view of the substrate processing unit 12. The substrate processing unit 12 is provided, in a "unit" chamber 42 thereof, with an outer chamber 43 of closed structure for accommodating the wafer W therein, and an "edge arm" housing 44. An opening 45 is formed in the "unit" chamber 42. The "unit" chamber 42 is provided with a mechanical shutter 46 that opens and closes the opening 45 by means of a not-shown closing mechanism. When the wafer W is loaded to or unloaded from the substrate processing unit 12 through the opening 45 by the transfer arm, the mechanical shutter 46 opens. The mechanical shutter 46 for unit chamber is adapted so as to open and close the opening 45 on the interior side of the "unit" chamber 42. Thus, even if a positive pressure is formed in the "unit" chamber 42, an atmosphere inside the "unit" chamber 42 can be prevent from leaking out.

An opening 47 is formed in the outer chamber 43. The outer chamber 43 is provided with a mechanical shutter 48 that opens and closes the opening 47 by means of a not-shown cylinder driving mechanism. When the wafer W is loaded to or unloaded from the outer chamber. 43 through the opening 47 by e.g. the transfer arm 34, the mechanical shutter 48 for outer chamber opens. The mechanical shutter 48 for outer chamber is adapted so as to open and close the opening 47 on the interior side of the outer chamber 43. Thus, even if a positive pressure is formed in the outer chamber 43, an atmosphere inside the outer chamber 43 can be prevent from leaking out.

An opening 49 is formed in the "edge arm" housing 44. The "edge arm" housing 44 is provided with a shutter 50 that opens and closes the opening 49 by means of a not-shown driving mechanism. When the "edge arm" housing 44 is insulated from the outer chamber 43 in terms of atmosphere therein, the shutter 50 for the edge-arm housing closes. The shutter 50 for "edge arm" housing is adapted so as to open and close the opening 49 on the interior side of the outer chamber 43. Thus, even if a positive pressure is formed in the "unit" chamber 42, an atmosphere inside the "unit" chamber 42 can be prevent from leaking out.

Accommodated in the "edge arm" housing 44 is an edge arm (unit) 60 which can eject a chemical liquid, pure water and also $N_2$-gas as an inert gas. The edge arm 60 can be also accommodated in the outer chamber 43 and is movable up to the periphery of the wafer W held by a later-mentioned spin chuck 71. The edge arm 60 takes shelter in the "edge arm" housing 44 except the processing operation. If the edge arm 60 moves into the outer chamber 43 through the opening 49, then the shutter 50 for the "edge arm" housing opens.

Figure 5:
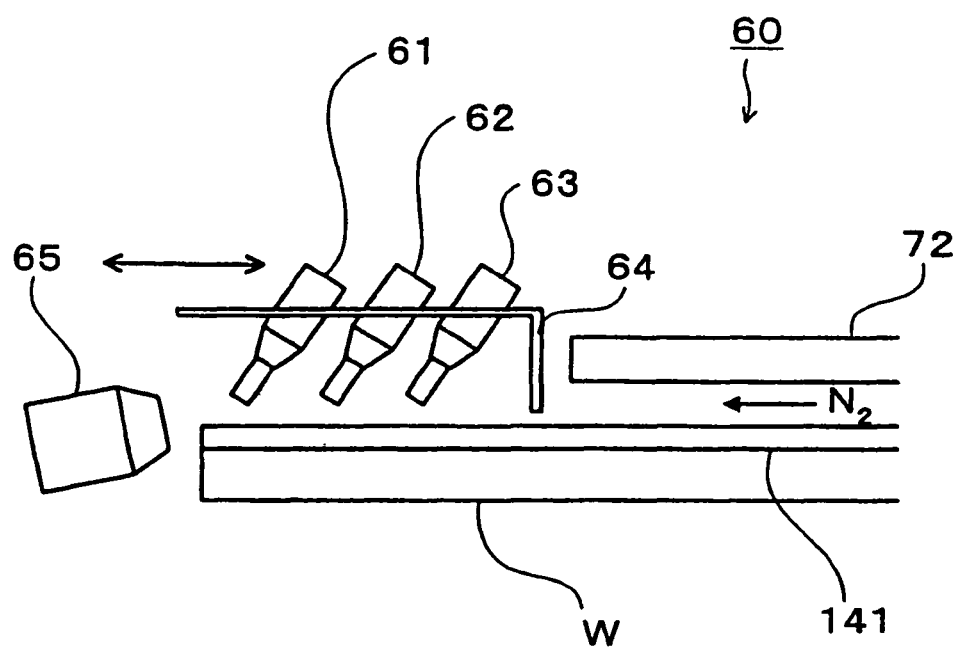
FIG. 5 is an explanatory view of an edge arm.

As shown in FIG. 5, the edge arm 60 includes a chemical nozzle 61 for supplying the wafer W (metallic membrane 141) with a chemical liquid, a pure-water nozzle 62 for supplying the wafer W with pure water as an inert liquid and a $N_2$-gas nozzle 63 for supplying the wafer W with $N_2$-gas as inert gas. The chemical nozzle 61, the pure-water nozzle 62 and the $N_2$-gas nozzle 63 are all arranged in one line connecting the center of the wafer W with its periphery. That is, according to the shown example, they are arranged in the radial direction of the wafer W in the form of a circular plate. A metallic film 141, such as copper, is laminated on the surface of the wafer W. The chemical nozzle 61 supplies a chemical liquid for removing the metallic film 141. The pure-water nozzle 62 adjoining on the inside of the chemical nozzle 61 supplies pure water for rinsing the peripheral part of the wafer W. The $N_2$-gas nozzle 63 adjoining on the inside of the pure-water nozzle. 62 supplies $N_2$-gas for drying the peripheral part of the wafer W.

The chemical nozzle 61, the pure-water nozzle 62 and the $N_2$-gas nozzle 63 are held by a cover plate 64 in order to prevent the chemical liquid, the pure water and $N_2$-gas, which have been supplied through the nozzles 61, 62, 63 respectively, from splashing. The chemical nozzle 61, the pure-water nozzle 62 and the $N_2$-gas nozzle 63 are inclined in a direction apart from the center of the wafer W. In detail, the chemical nozzle 61, the pure-water nozzle 62 and the $N_2$-gas nozzle 63 have their tips directing the outer circumference of the wafer W. On the circumferential side of the wafer W over the chemical nozzle 61, a suction nozzle 65 is arranged to suck the chemical liquid, the pure water and $N_2$-gas supplied through the nozzles 61, 62, 63 respectively and also an atmosphere produced during the processing.

Figure 6:
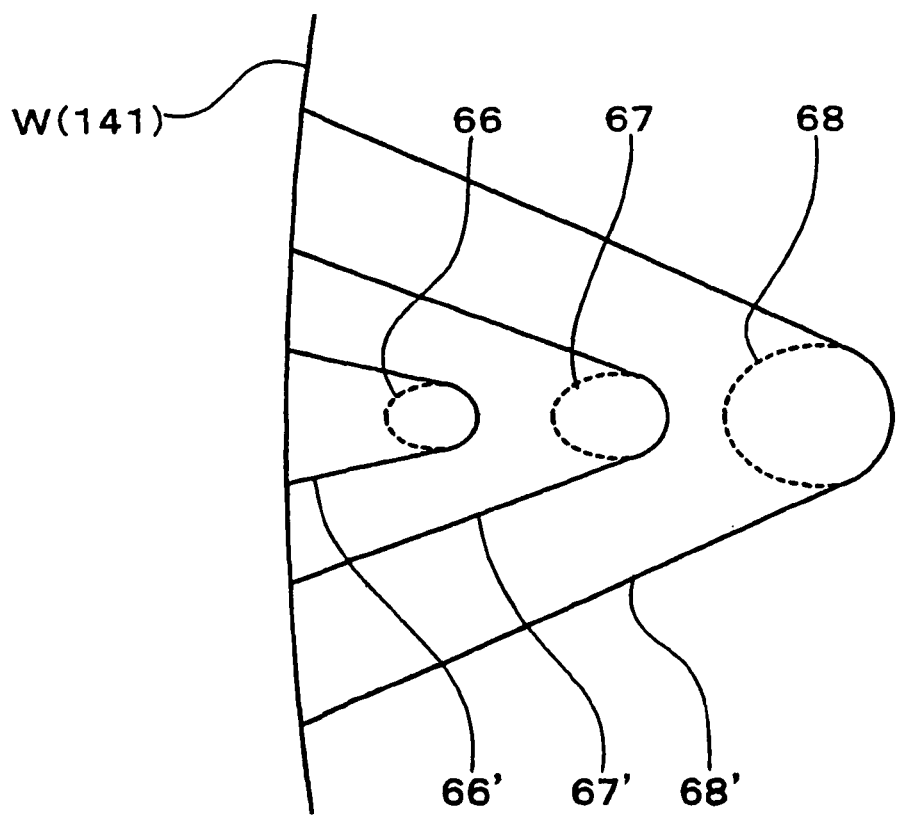
FIG. 6 is an explanatory view showing respective wafer's surfaces to which respective processing liquids are supplied from a chemical-liquid nozzle, a pure-water nozzle and a $N_2$-gas nozzle and also respective wafer's surfaces on which the processing liquids flow subsequently to the supply.

In case of supplying the chemical liquid to the wafer W by the chemical nozzle 61, the $N_2$-gas nozzle 63 begins the supply of $N_2$-gas in advance of the supply of the chemical liquid. In this case, as shown in FIG. 6, the $N_2$-gas nozzle 63 supplies $N_2$-gas onto an area 68 on the wafer W. The $N_2$-gas supplied onto the area 68 flows on the surface of the wafer W (surface of the metallic film 141) in the form of a fan directing the peripheral part of the wafer W, providing a flowing area 68'. On the other hand, the chemical nozzle 61 supplied the chemical liquid onto an area 66 on the wafer W, so that the chemical liquid supplied to the area 66 flows on the wafer W while directing its peripheral part, providing a fan-shaped flowing area 66'. These areas 66, 66' are together included in the area 68'. Thus, as mentioned before, when the $N_2$-gas nozzle 63 begins the supply of $N_2$-gas in advance of the supply of the chemical liquid by the chemical nozzle 61, the chemical liquid is certainly supplied to the area 66 and subsequently, the same liquid is swept away toward the periphery of the wafer W owing to the flowing of $N_2$-gas in the form of the area 68'. In this way, there is no fear that the chemical liquid through the chemical nozzle 61 flows toward the center of the wafer W.

In case of supplying the pure water to the wafer W by the pure-water nozzle 62, the $N_2$-gas nozzle 63 begins the supply of $N_2$-gas in advance of the supply of the pure water. In this case, as shown in FIG. 6, the $N_2$-gas nozzle 63 supplies $N_2$-gas onto the area 68 on the wafer W. The $N_2$-gas supplied onto the area 68 flows on the surface of the wafer W while directing the periphery of the wafer W, providing the fan-shaped flowing area 68'. On the other hand, the pure-water nozzle 62 supplied the pure water onto an area 67 on the wafer W, so that the pure water supplied to the area 67 flows on the wafer W while directing its periphery, providing a fan-shaped flowing area 67'. These areas 67, 67' are together included in the area 68'. Thus, as mentioned before, when the $N_2$-gas nozzle 63 begins the supply of $N_2$-gas in advance of the supply of the pure water by the pure-water nozzle 62, the pure water is certainly supplied to the area 67 and subsequently, the pure water is swept away toward the periphery of the wafer W owing to the flowing of $N_2$-gas in the form of the area 68'. In this way, there is no fear that the pure water through the pure-water nozzle 62 flows toward the center of the wafer W. Note, in order to make sure that the chemical liquid and the pure water are swept away by $N_2$-gas flowing in the form of the area 68', it is desirable that the area 68 of $N_2$-gas supply is wider than either of the areas 66, 67. Then, it becomes possible to supply $N_2$-gas such that a width of the area 68' in the circumferential direction of the wafer W becomes broader than either width of the areas 66', 67'.

Figure 7:
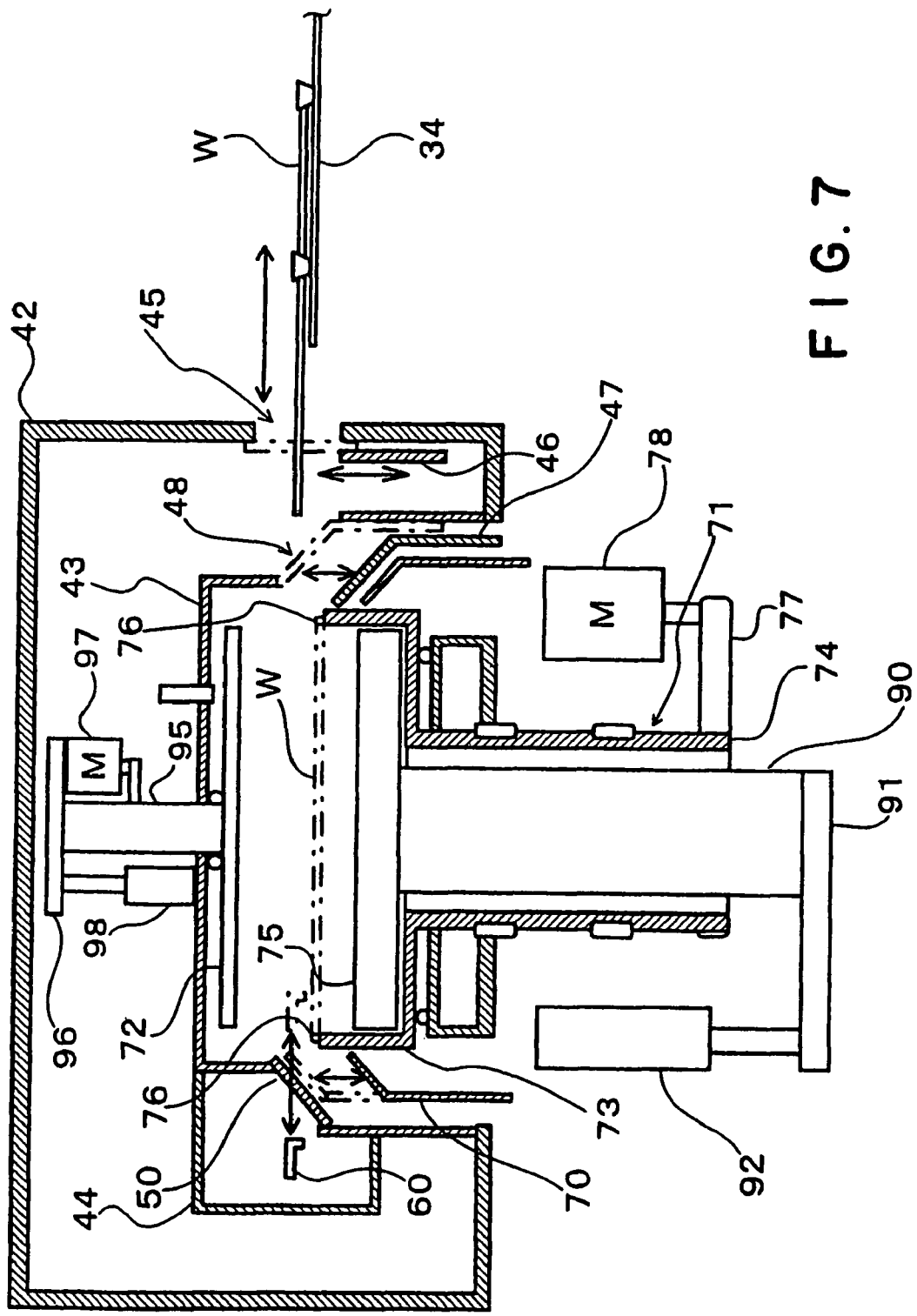
FIG. 7 is a sectional view of the processing system of the embodiment of the invention.

As shown in FIG. 7, the outer chamber 43 includes an inner cup 70 for accommodating the wafer W, a spin chuck 71 (as a holder) for holding the wafer W rotatably while directing the surface of the wafer W upward and a top plate 72 that moves up and down in relation to the upper face of the wafer W (the surface of the wafer W).

The spin chuck 71 includes a chuck body 73 for holding the wafer W and a rotating cylinder 74 connected with the bottom of the chuck body 73. Disposed in the chuck body 73 is an under plate 75 which moves up and down with respect to the under face (back face) of the wafer W held by the spin chuck 71, relatively.

The upper part of the chuck body 73 is equipped, at several positions, with not-shown support pins for supporting the peripheral part of the back face of the wafer W and holding members 76 for holding the peripheral part of the wafer W. In the shown example, three holding members 76 are arranged at intervals of 120 degrees in the circumference of the chuck body 73. Thus, the periphery of the wafer W can be held by these members 76. Further, the chuck body 73 is provided, at intervals of 120 degrees in the circumference of the wafer W, with three support pins which support the wafer W from the underside and which are not shown in the figure. A belt 77 is wound about the circumferential face of the rotating cylinder 74. Owing to a motor 78, the resulting circumferential movement of the belt 77 allows the spin chuck 71 to be rotated as a whole. As shown in FIG. 4, the holding members 76 are adapted so as to hold the peripheral part of the wafer W from the outside owing to centrifugal force produced by the rotation of the spin chuck 71. When the spin chuck 71 comes to a standstill, the above support pins support the back face of the wafer W. While, when the spin chuck is rotating, the holding members 76 hold the peripheral part of the wafer W.

Figure 8:
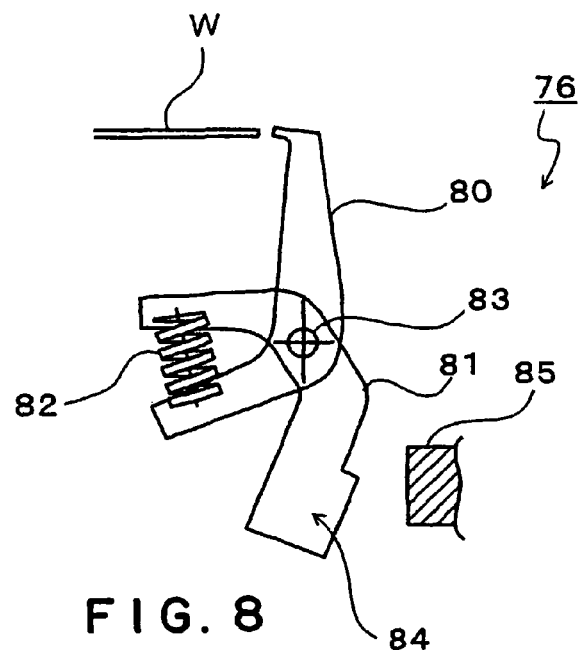
FIG. 8 is an explanatory view showing the state of a holding member at a standstill.
Figures 9, 10:
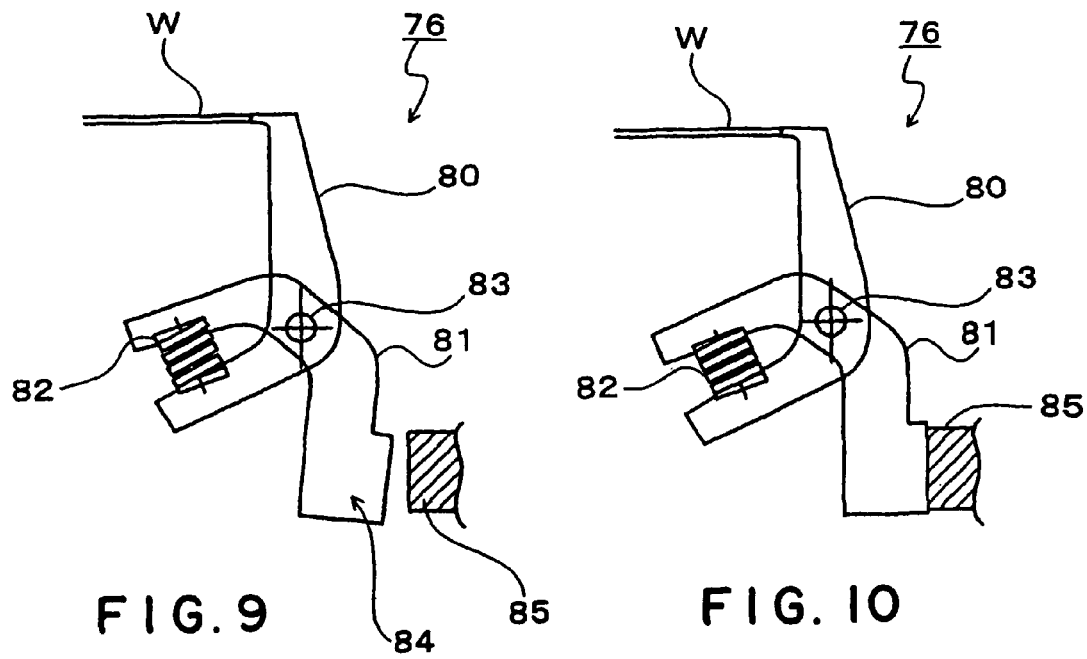
FIG. 9 is an explanatory view showing the state of the holding member when rotating at a middle speed.
FIG. 10 is an explanatory view showing the state of the holding member when rotating at a high speed.

FIG. 8 shows each structure of the holding members 76 for holding the wafer W. The holding member 76 is formed by a grasping arm 80, a pusher arm 81 and a spring 82. Both of the grasping arm 80 and the pusher arm 81 are rotatable about a pivot 83 as the rotating center. The spring 82 is interposed between the grasping arm 80 and the pusher arm 81. The pivot 83 is fixed on the chuck body 73. The pusher arm 81 is provided, at the lowermost, with a weight 84. The rotation of the spin chuck 71 causes the weight 84 to be shifted outside by a centrifugal force applied thereon, as shown in FIG. 9. Consequently, as the upper part of the grasping arm 80 moves inside, it is possible to hold the periphery of the wafer W. Then, since the spring 82 absorbs so-generated energy, it becomes possible to prevent a pressure to hold the periphery of the wafer W (holding force) from increasing excessively.

When the spin chuck 71 rotates at high speed, the weight 84 comes in abutment with a stopper 85 in the chuck body 73, as shown in FIG. 10. Then, as the spring 82 absorbs generated energy, it is possible to a holding force from increasing excessively.

The under plate 75 is connected with the top of an under-plate shaft 90 penetrating the chuck body 73 and the rotating cylinder 74. The under-plate shaft 90 is secured on the upper face of a horizontal plate 91. By an elevating mechanism 92, such as cylinder, the horizontal plate 91 is moved up and down in the vertical direction, in one body with the under-plate shaft 90. Accordingly, the under plate 75 can be lowered in the chuck body 73 into a condition where the plate 75 are waiting in readiness apart from the under face of the wafer W held by the spin chuck 71 (see FIG. 7; withdrawal position). While, the under plate 75 can be also elevated in the chuck body 73 into a condition where the under face of the wafer W held by the spin chuck 71 is being cleaned (see FIG. 18; processing position). That is, the under plate 75 is movable up and down between the processing position and the withdrawal position. Alternatively, there may be provided the under plate 75 which is movable between the processing position and the withdrawal position by the following steps of: fixing the under plate 75 at a designated level; connecting the rotating cylinder 74 with a not-shown elevating mechanism; and moving the whole spin chuck 71 up and down.

The top plate 72 is connected with the lower end of a rotating shaft 95 and rotated by a motor 97 mounted on a horizontal plate 96. The rotating shaft 95 is rotatably supported on the lower face of the horizontal plate 96. The horizontal plate 96 can move up and down in the vertical direction by a shaft-elevating mechanism 98, such as air cylinder, secured on the top of the outer chamber. Therefore, owing to the operation of the shaft-elevating mechanism 98, the top plate 72 is movable up and down between a condition where the plate 72 are waiting in readiness apart from the upper face of the wafer W held by the spin chuck 71 (see FIG. 7; withdrawal position) and another condition where the plate 72 adjoins the upper face of the wafer W held by the spin chuck 71 (see FIG. 17; processing position). Further, as shown in FIG. 4, since the diameter of the top plate 72 is smaller than that of the wafer W, the edge arm 60 can process the peripheral part of the wafer W.

The inner cup 70 can be lowered to a position of FIG. 7 to allow the spin chuck 71 to project from the upper end of the inner cup 70, establishing a condition that the spin chuck 71 can deliver the wafer W. While, the inner cup 70 can be also elevated to a position of FIG. 17 to surround the spin chuck 71 and the wafer W, establishing another condition to prevent cleaning chemical liquids, processing liquids, etc. supplied on both faces of the wafer W from splashing around.

When it is required to lower the inner cup 70 to the position of FIG. 7 thereby to allow the spin chuck 71 to transfer the wafer W, the under plate 75 is positioned at the withdrawal position and the top plate is also positioned at the withdrawal position. Consequently, there can be defined a sufficient clearance between the under plate 75 and the wafer W held by the spin chuck 71. Additionally, there is also defined a sufficient clearance between the top plate 72 and the upper face of the wafer W. In this way, the transfer of the wafer W about the spin chuck 71 can be accomplished smoothly.

Figure 11:
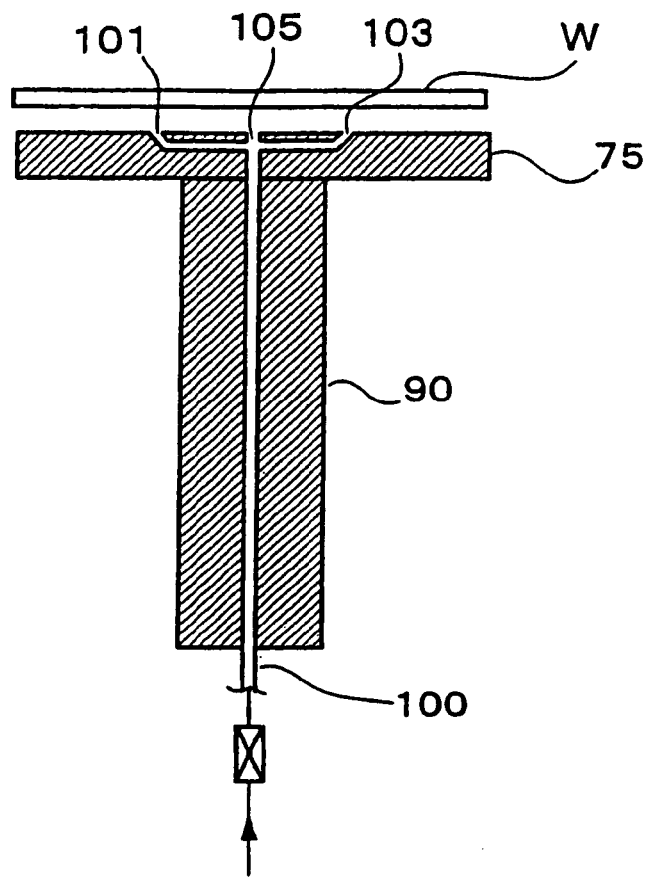
FIG. 11 is a longitudinal sectional view of an under plate and an under-plate shaft.
Figure 12:
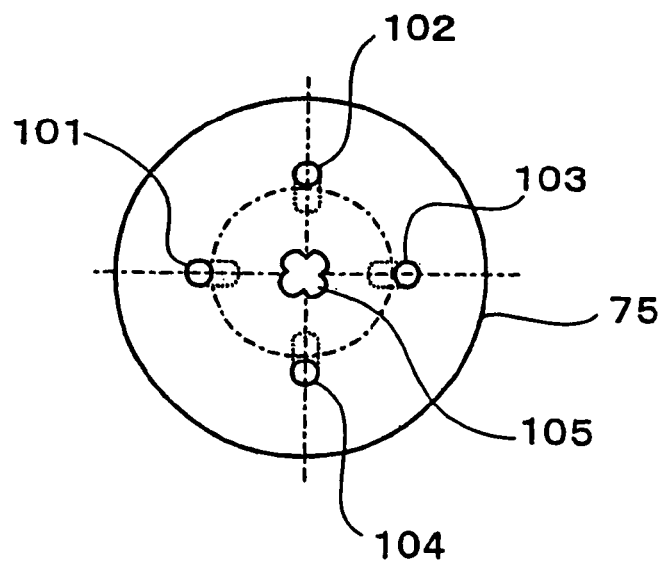
FIG. 12 is a plan view of the under plate.

As shown in FIG. 11, the under plate 75 is provided with a lower supply path 100 which penetrates the under-plate shaft 90 to supply the lower face of the wafer W with the processing liquids (e.g. cleaning chemical liquids, pure water) and dry gas. As shown in FIG. 12, the under plate 75 has lower ejection ports 101-105 formed at its center and the surroundings to eject cleaning chemicals/pure water/$N_2$-gas. The lower ejection ports 101-104 around the center of the plate 75 are inclined toward the periphery of the wafer W, while the center ejection port 105 directs the center of the wafer W upward.

Figure 13:
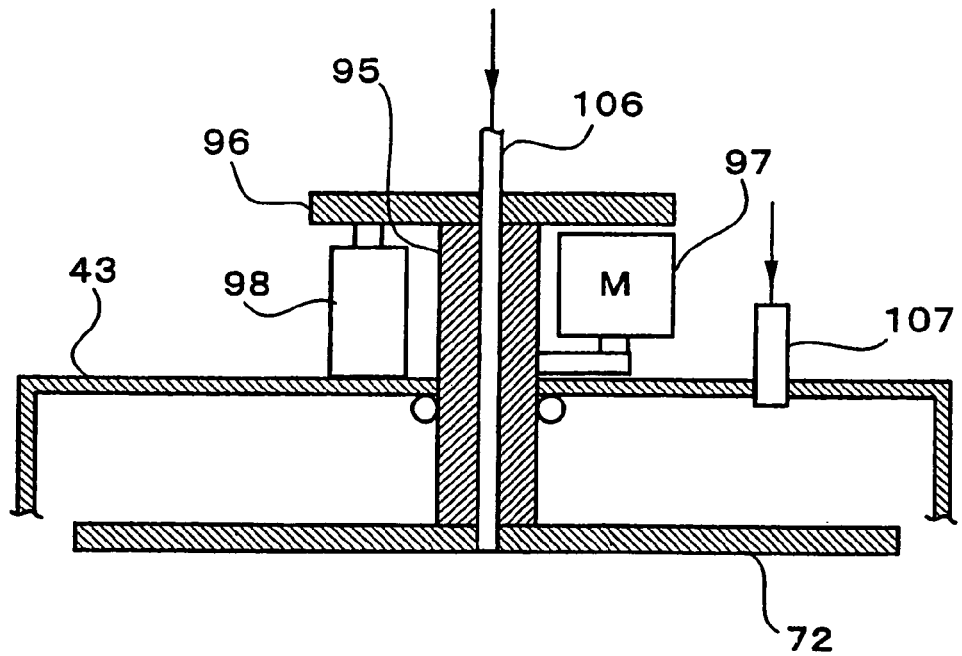
FIG. 13 is a longitudinal sectional view showing an enlarged top part of an outer chamber.

As shown in FIG. 13, the top plate 72 is provided with an upper supply path 106 which penetrates the rotating shaft 95 to supply the wafer with e.g. $N_2$-gas. The outer chamber 43 is equipped, on its top, with a $N_2$-gas supplier 107 to eject $N_2$-gas between the upper face of the top plate 72 and the interior of the outer chamber.

Figure 14:
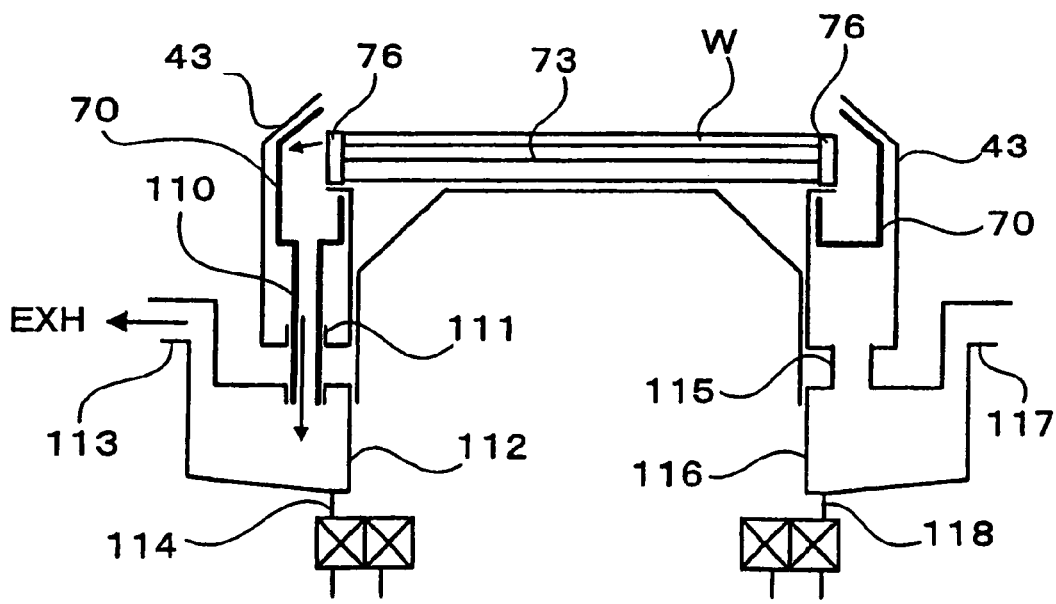
FIG. 14 is an explanatory view of a process of discharging droplets in an inner cup to a mist trap.

As shown in FIG. 14, an "inner-cup" drain pipe 110 is connected with the bottom of the inner cup 70 to discharge liquid and droplets in the inner cup 70. The "inner-cup" drain pipe 110 is movable up and down through a through-port 111 formed on the bottom of the outer chamber 43. The lower end of the "inner-cup" drain pipe 110 is inserted into an "inner-cup" mist trap 112. Owing to the provision of the "inner-cup" mist trap 112, it is possible to remove air-bubbles in the liquid and droplets discharged from the inner cup 70. The air bubbles on removal is discharged through a mist-trap exhaust pipe 113 connected with the "inner-cup" mist trap 112. The liquid and droplets after the removal of air bubbles is collected by an "inner-cup" waste-fluid collecting line 114 connected to the "inner-cup" mist trap 112.

An "outer-chamber" drain pipe 115 is connected with the bottom of the outer chamber 43 to drain liquid and droplets therefrom. The drain pipe 115 is provided with a "outer-chamber" mist trap 116 which eliminates air bubbles from the liquid and droplets drained from the mist trap 116. The air bubbles on removal is discharged through a "outer-chamber" mist-trap exhaust pipe 117 connected with the "outer-chamber" mist trap 116. The liquid and droplets after the removal of air bubbles is collected by an "outer-chamber" waste-fluid collecting line 118 connected to the "outer-chamber" mist trap 116.

Figure 15:
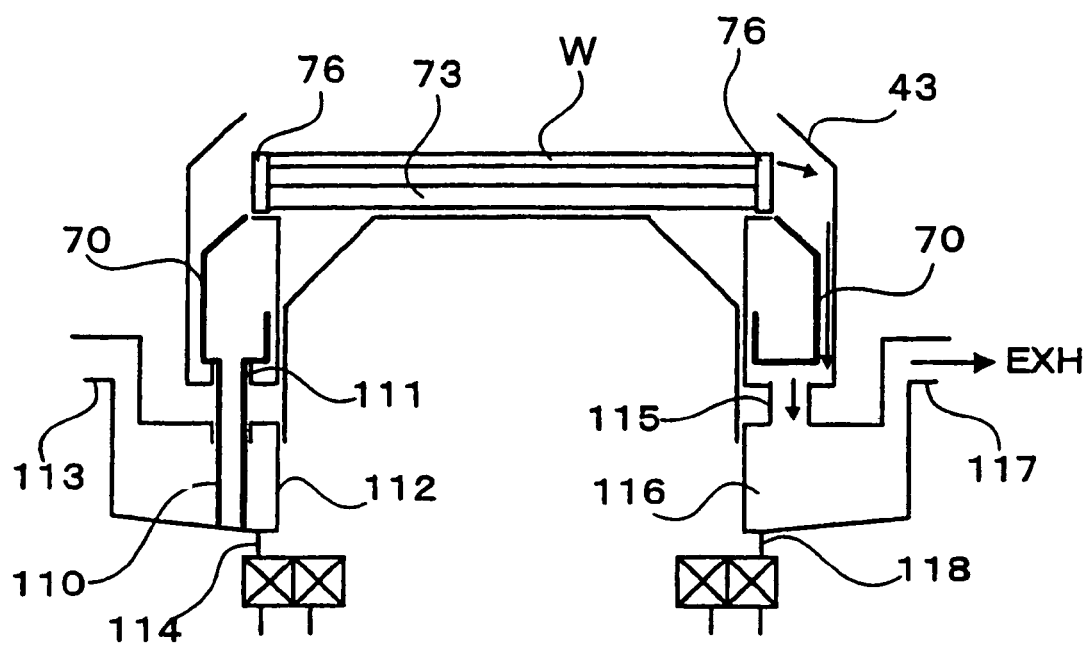
FIG. 15 is an explanatory view of a process of discharging droplets in the outer chamber to the mist trap.
Figure 16:
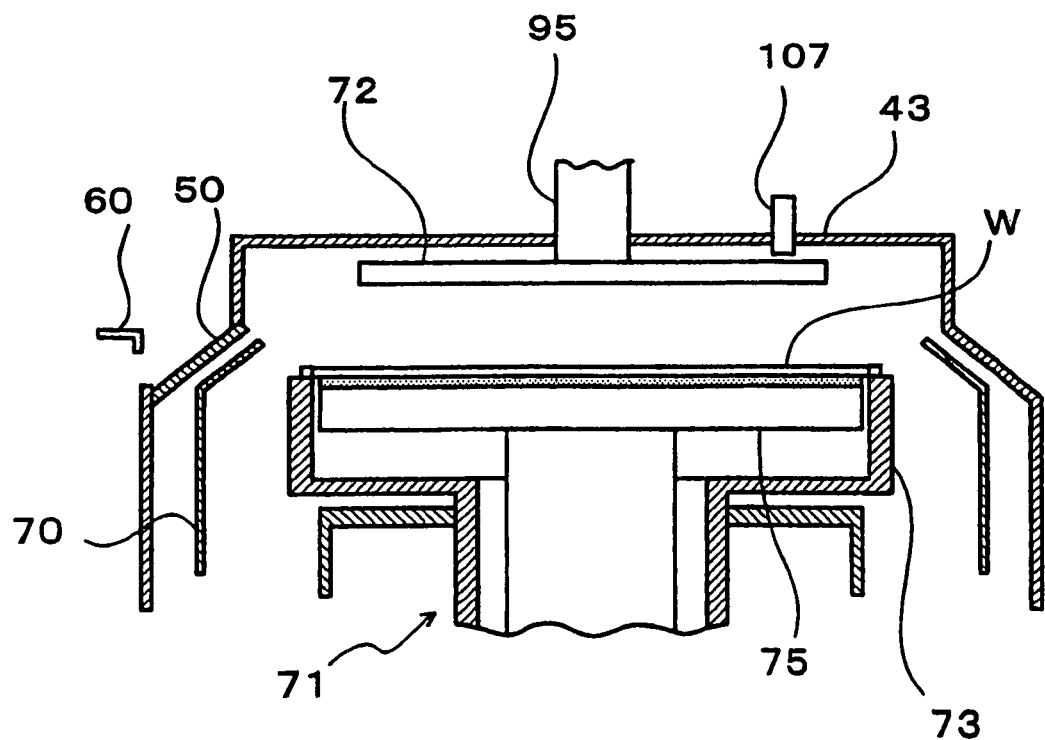
FIG. 16 is an explanatory view of a process of paddle-cleaning the back face of the wafer.

When the inner cup 70 drops, there is realized a condition of FIG. 15 where the spin chuck 71 and the wafer W held by the chuck 71 project from the upper end of the inner cup 70 upward. Then, the liquid and droplets in the outer chamber 43 moves down outside the inner cup 70 and is drained through the "outer-chamber" drain pipe 115. On the other hand, when the inner cup 70 is elevated as shown in FIG. 14, there is realized a condition that the inner cup 70 surrounds the spin chuck 71 and the wafer W thereby to prevent the cleaning liquid etc. supplied to both faces of the wafer W from splashing around. Then, the upper part of the inner cup 70 approaches the inner wall of the outer chamber 43, so that the liquid and droplets in the inner cup 70 is drained through the "inner-cup" drain pipe 110.

Note, the substrate processing unit 13 of the cleaning system 1 has a structure similar to that of the substrate processing unit 12 and is capable of cleaning of the back face of the wafer W, removal of the peripheral part of the surface of the wafer W and also cleaning of the surface of the wafer W (Back-Bevel cleaning).

Further, the substrate cleaning units 14, 15 of the cleaning system 1 are constructed so as to have the ability to clean both faces of the wafer W by various kinds of cleaning liquids and further dry the wafer W.

Now, in the cleaning system 1 mentioned above, a not-shown transfer robot first lays the carriers C each accommodating the wafers W, for example, twenty-five wafers W on the in/out port 4. Next, the pickup/accommodating arm 11 takes the wafers W out of the carrier C one by one and successively delivers the wafer W to the main wafer transfer unit 7. Next, by the transfer arm 34, the wafer W is suitably loaded into the substrate processing unit 12 or 13, performing the cleaning of the back face of the wafer W, removal of the peripheral part of the surface of the wafer W and also cleaning of the peripheral part of the wafer W. Further, the wafer W is suitably loaded into the substrate cleaning unit 14 or 15 where contaminants, such as particles, sticking to the wafer W are cleaned for removal. In this way, the wafer W after completing the designated cleaning process is suitably unloaded from the substrate processing units 12, 13 or the substrate cleaning units 14, 15 by main wafer transfer unit 7. Subsequently, the wafers W is delivered to the loaded pickup/accommodating arm 11 and successively accommodated in the carrier C again.

Being representative of the substrate processing units 12, 13, we now describe the processing operation at the substrate processing unit 12. As shown in FIG. 7, the mechanical shutter 46 of the substrate processing unit 12 opens at first, while the mechanical shutter 47 for the outer chamber 43 also opens. Then, the transfer arm 34 carrying the wafer W enters the unit. The inner cup 70 is lowered to project the chuck body 73 relatively upward. In advance of that, the under plate 75 is lowered to occupy the withdrawal position in the chuck body 73. The top plate 72 is elevated to occupy its withdrawal position in advance. Further, the shutter 50 for the edge-arm housing is closed.

The main wafer transfer unit 18 lowers the transfer arm 34 to deliver the wafer W to the holding member 76. Then, the spin chuck 71 supports the wafer W by means of not-shown support pins while directing the wafer's surface for semiconductor devices upward. Then, since the under plate 75 has been moved to the withdrawal position and is apart from a level (height) of the wafer W held by the spin chuck 71, the transfer arm 34 allows the wafer W to be delivered to the spin chuck 71 with composure. After delivering the wafer W to the spin chuck 71, the transfer arm 34 withdraws from the interior of the outer chamber 43 and the interior of the mechanical shutter 46. After the withdrawal of the transfer arm 34, both of the mechanical shutter 46 for the substrate processing unit 12 and the mechanical shutter 47 of the outer chamber 43 are together closed.

Figure 17:
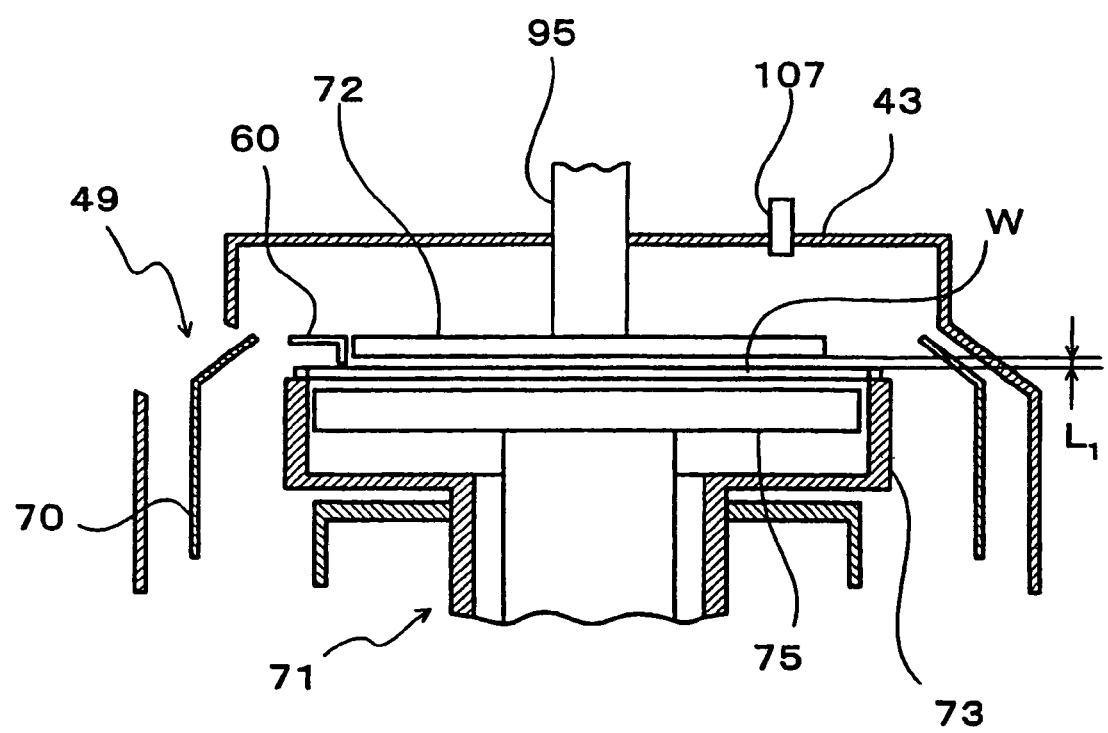
FIG. 17 is an explanatory view of a process of removing the peripheral part of the wafer.

The inner cup 70 is elevated into a condition to surround the chuck body 73 and the wafer W. The under plate 75 rises up to the processing position in the chuck body 73. As shown in FIG. 17, there is produced a clearance L1 (for example, a clearance on the order of 0.5-3 [mm]) between the under plate 75 moved to the processing position and the back face of the wafer W held by the spin chuck 71.

Next, the cleaning process for the back face of the wafer W is carried out. Through the lower supply path 100, the chemical liquid for cleaning is quietly fed onto the under plate 75 to supply the clearance L1 with the chemical liquid for cleaning. By spreading the chemical liquid for cleaning over the whole lower face of the wafer W in the narrow clearance L1, there is formed a liquid film composed of the chemical liquid for cleaning, which comes into uniform contact with the whole lower face of the wafer W. If the liquid film of chemical liquid for cleaning is formed all over the clearance L1, the supply of chemical liquid for cleaning is stopped to clean the lower face of the wafer W. By filling the clearance L1 with the chemical liquid for cleaning thereby to form a liquid film, it is possible to prevent the breakdown in shape of the liquid film composed of the chemical liquid for cleaning, owing to the formation of surface tension. To the contrary, if the shape of liquid film of cleaning chemical collapses, then a problem of inferior cleaning arises in that the lower face of the wafer W may include portions in no contact with the liquid film of cleaning chemical or that the air bubbles may enter the liquid film. However, according to the embodiment, since the narrow clearance L1 between the under plate 75 and the lower face of the wafer W is filled up with the chemical liquid for cleaning, it is possible to maintain the shape of liquid film composed of the chemical liquid for cleaning, preventing the occurrence of inferior cleaning.

In this case, the spin chuck 71 rotates the wafer W at a relatively-low speed (e.g. the order of 10 to 30 rpm) so as to maintain a shape of the liquid film of chemical liquid for cleaning. The rotation of the wafer W causes the generation of a liquid flow in the liquid film of chemical liquid for cleaning. Owing to the generation of this liquid flow, it becomes possible to prevent an occurrence of stagnation in the liquid film of chemical liquid for cleaning and also possible to improve the cleaning efficiency of the apparatus. The rotation of the wafer W may be carried out intermittently. For example, the wafer W is rotated for a predetermined period or at predetermined revolutions and thereafter, the rotating operation of the spin chuck 71 is stopped for a predetermined period thereby to bring the wafer W to a standstill. Subsequently, the wafer W is rotated again. In this way, the repetition of the wafer W between rotation and standstill allows the chemical liquid for cleaning to diffuse all over the lower face of the wafer W with ease. Of course, it is also possible to perform the cleaning operation while maintaining the wafer W at a standstill with no rotation. Further, once the liquid film is formed on the wafer W, there is no need to further supply the wafer W with new cleaning chemical. Because the whole lower face of the wafer W can be cleaned by the chemical liquid for cleaning which has been already supplied between the under plate 75 and the lower face of the wafer W unless the shape of the liquid film of chemical liquid for cleaning collapses. On the other hand, when the shape of the liquid film of chemical liquid for cleaning is likely to collapse, a new liquid is supplied to repair the shape of the liquid film of chemical liquid for cleaning appropriately. In this way, the consumption of the chemical liquid for cleaning can be saved. Note, if the chemical liquid for cleaning is successively supplied through the lower supply path 100 while dropping the liquid and droplets of the liquid film of chemical liquid for cleaning from the margin of the under plate 75, then it is possible to perform a preferable cleaning process using the chemical liquid for cleaning by always replacing the inside of the liquid film of chemical liquid for cleaning with a brand-new chemical liquid for cleaning. Also in this case, it is desirable to supply a new liquid as quiet as possible in view of saving the consumption of the chemical liquid for cleaning.

On the other hand, when forming the liquid film by filling the clearance L1 with the chemical liquid for cleaning, it is carried out to allow the chemical liquid to make a detour to the surface's side of the wafer W (a surface of the metallic film 141) via the peripheral part of the back face of the wafer W, thereby supplying the chemical liquid for cleaning up to the peripheral part on the surface of the wafer W, as the object to be eliminated in the later-mentioned removal process. Then, the cleaning process of the peripheral part on the surface of the wafer W is carried out at the same time of the cleaning process of the back face of the wafer W.

Subsequently, the spin chuck 71 rotates, for example, at 2,000 rpm for five seconds. As a result, the chemical liquid for cleaning is shaken down from the wafer W and continuously drained into the "inner-cup" drain pipe 110. When the spin chuck 71 rotates at a high speed, the (three) holding member 76 on the chuck body 73 are brought into a condition of FIG. 10 respectively. That is, the lower part of the pusher arm 81 abuts against the inside of the chuck body 73. Therefore, since a grasping force for the wafer W originates in the spring 82 during the high-speed rotation, the wafer W is not subjected to an excessive holding force.

Next, it is carried out to supply $N_2$-gas between the under plate 75 and the lower face of the wafer W through the lower supply path 100, for example, for 10 seconds in order to discharge an atmosphere of the chemical liquid below the wafer W. The supply of $N_2$-gas allows the droplets of the chemical liquid to be removed from the back face of the wafer W.

Next, the top plate 72 moves to a position adjacent to the upper face of the wafer W. The shutter 50 for edge-arm housing opens and the edge arm 60 moves to the upside of the peripheral part of the wafer W carried by the spin chuck 71. When the edge arm 60 reaches a designated position, the $N_2$-gas nozzle 63 on the arm 60 begins the supply of $N_2$-gas and successively, the chemical nozzle 61 begins the supply of the chemical liquid. Then, there is performed a peripheral-part removing process to remove the corner of the metallic film 141 laminated on the surface of the wafer W.

During the peripheral-part removing process, the spin chuck 71 rotates at revolutions of the order of 300 rpm, for example. As mentioned before, since three holding members 76 are brought into a condition of FIG. 9 respectively, an appropriate holding force against the wafer W is produced, so that the spin chuck 71 can rotate the wafer W.

As the tip of the chemical nozzle 61 directs the circumference of the wafer W, the ejected chemical liquid flows to the outside of the wafer W smoothly. The chemical liquid supplied from the chemical nozzle 61 is swept away toward the circumference of the wafer W by $N_2$-gas supplied from the $N_2$-gas nozzle 63. As the tip of the $N_2$-gas nozzle 63 directs the circumference of the wafer W, $N_2$-gas supplied from the $N_2$-gas nozzle 63 allows the chemical liquid to be swept away toward the circumference of the wafer W effectively. It is noted that, on the surface of the wafer W (surface of the metallic film 141), the area 66 on chemical supply and the area 66' on chemical flow are together included in the area 68'. Additionally, since the $N_2$-gas nozzle 63 begins the supply of $N_2$-gas before starting the supply of the chemical liquid by the chemical nozzle 61, there is no possibility that the chemical liquid supplied from the chemical nozzle 61 flows toward the center of the wafer W. On the other hand, the so-swept chemical liquid, $N_2$-gas and the chemical atmosphere generated at processing are all sucked for discharge in the circumference of the wafer W by the suction nozzle 65. Further, the cover plate 64 carrying the chemical nozzle 61 and the $N_2$-gas nozzle 63 prevents the chemical liquid from splashing to the inside face of the wafer W. Additionally, by collecting the chemical liquid, which has been swept away by $N_2$-gas, and successively applying an appropriate treatment on the chemical liquid, it can be reused with ease.

During the peripheral-part removing process, the top plate 72 is lowered to a position of FIG. 17 (processing position) and $N_2$-gas is supplied through the upper supply path 106. The $N_2$-gas through the upper supply path 106 prevents the chemical liquid supplied from the chemical nozzle 61 and the chemical atmosphere generated during the peripheral-part removing process from flowing into the center face of the wafer W. In this way, $N_2$-gas supplied from the $N_2$-gas nozzle 63 prevents the chemical liquid from flowing on the wafer's surface on $N_2$-gas supply and also flowing outside the flowing the wafer's surface on $N_2$-gas flowing. Further, $N_2$-gas supplied from the upper supply path 106 prevents the chemical liquid from flowing into the center face of the wafer W. Therefore, it is possible to prevent the chemical liquid from flowing into the inside face of the wafer W effectively. Additionally, the supply of $N_2$-gas through the upper supply path 106 has an effect to prevent an occurrence of water-marks on the wafer W.

Again, during the peripheral-part removing process, the $N_2$-gas supplier 107 at the top of the outer chamber 43 supplies $N_2$-gas onto the top plate 72 thereby to form downward flows of $N_2$-gas. Since a space between the upper face of the top plate 72 and the outer chamber 43 is filled up with $N_2$-gas, the chemical atmosphere that rises about the top plate 72 as a result of evaporation of the liquid film of the chemical liquid does not invade the space above the top plate 72. Therefore, it is possible to prevent the chemical liquid from remaining in the upper part of the outer chamber 43 after the peripheral-part removing process.

When the peripheral-part removing process is completed, the chemical nozzle 61 stops the supply of the chemical liquid. The $N_2$-gas nozzle 63 still maintains the supply of $N_2$-gas and subsequently, the pure-water nozzle 62 starts the supply of pure water. In this way, the peripheral-part rinsing process to supply the peripheral part of the wafer W with pure water is started. As the tip of the pure-water nozzle 62 directs the circumference of the wafer W, the ejected pure water flows to the outside of the wafer W smoothly. The pure water supplied from the pure-water nozzle 62 is swept away toward the circumference of the wafer W by $N_2$-gas supplied from the $N_2$-gas nozzle 63. As the tip of the $N_2$-gas nozzle 63 directs the circumference of the wafer W, $N_2$-gas supplied from the $N_2$-gas nozzle 63 allows the pure water to be swept away toward the circumference of the wafer W effectively. It is noted that, on the surface of the wafer W (surface of the metallic film 141), the area 66 on pure-water supply and the area 66' on pure-water flow are together included in the area 68'. Additionally, since the $N_2$-gas nozzle 63 begins the supply of $N_2$-gas before starting the supply of the pure water by the pure-water nozzle 62, there is no possibility that the pure water supplied from the pure-water nozzle 62 flows toward the center of the wafer W. On the other hand, the so-swept pure water, $N_2$-gas and a vapor atmosphere generated at processing are all sucked for discharge in the circumference of the wafer W by the suction nozzle 65. Further, the cover plate 64 carrying the pure-water nozzle 62 and the $N_2$-gas nozzle 63 prevents the pure water from splashing to the inside face of the wafer W. On the other hand, the lower supply path 100 supplies a clearance between the under plate 75 and the lower face of the wafer W with pure water, performing the back-face rinsing process. In this way, by rinsing both peripheral part and back face of the wafer W, the chemical liquid is washed from the wafer W.

Also in the rinsing process, the top plate 72 is lowered to the processing position and $N_2$-gas is supplied through the upper supply path 106. The $N_2$-gas through the upper supply path 106 prevents the pure water supplied from the pure-water nozzle 62 and the vapor atmosphere generated during the peripheral-part rinsing process from flowing into the center face of the wafer W. In this way, $N_2$-gas supplied from the $N_2$-gas nozzle 63 prevents the pure water from flowing on the wafer's surface on $N_2$-gas supply and also flowing outside the flowing the wafer's surface on $N_2$-gas flowing. Further, $N_2$-gas supplied from the upper supply path 106 prevents the pure water from flowing into the center face of the wafer W. Therefore, it is possible to prevent the pure water from flowing into the inside face of the wafer W effectively. Additionally, the supply of $N_2$-gas through the upper supply path 106 has an effect to prevent an occurrence of water-marks on the wafer W.

When the rinsing process is completed, the supply of pure water through the pure-water nozzle 62 and the lower supply path 100 is stopped. The $N_2$-gas nozzle 63 continues to supply the circumference of the wafer W with $N_2$-gas, executing the peripheral-part drying process. As the tip of the $N_2$-gas nozzle 63 directs the circumference of the wafer W, $N_2$-gas is easy to flow to the outside of the wafer W. Then, the suction nozzle 65 sucks $N_2$-gas for its discharge. On the other hand, the lower supply path 100 supplies a clearance between the under plate 75 and the lower face of the wafer W with $N_2$-gas thereby to carry out the back-face drying process. In the above way, both peripheral part and back face of the wafer W are dried. After completing the peripheral-part drying process and the back-face drying process, the supply of $N_2$-gas through the $N_2$-gas nozzle 63 and the lower supply path 100 is stopped, while the top plate 72 is elevated up to a position apart from the upper face of the wafer W. Next, the wafer W is rotated at a high speed (e.g. the order of 1500 rpm) in comparison with a rotating speed in the drying process, performing a spin drying process.

After the spin drying process, the edge arm 6.0 moves into the edge-arm housing 44 and the shutter 50 for edge-arm housing is closed. Next, the wafer W is discharged from the substrate processing unit 12. The mechanical shutter 46 for the substrate processing unit 12 opens and the mechanical shutter 47 for the outer chamber 43 opens as well. Then, the transfer arm 34 of the wafer transfer arm 18 enters into the unit 12 to support the lower face of the wafer W. Next, the transfer arm 34 receives the wafer W from the support pins of the spin chuck 71 and continuously withdraws from the unit 12. During this process, since the under plate 75 is positioned at the withdrawal position, there is produced a sufficient clearance between the under plate 75 and the wafer W held by the spin chuck 71, allowing the transfer arm 34 to receive from the spin chuck 71 with composure.

According to the substrate processing apparatus 12 mentioned above, during the peripheral-part removing process, it is possible to sweep away the chemical liquid outside of the wafer W effectively. Further, the apparatus 12 prevents the chemical liquids, the pure water, the chemical atmosphere and the vapor atmosphere from flowing into the center face of the wafer W. During the peripheral-part rinsing process, the apparatus is capable of sweeping away the pure water outside of the wafer W effectively. Additionally, it is possible to dry the wafer's face onto which the pure water has been supplied. Despite that the spin chuck 71 rotates at a high speed, the wafer W is not subjected to an excessive holding force.

Figure 18:
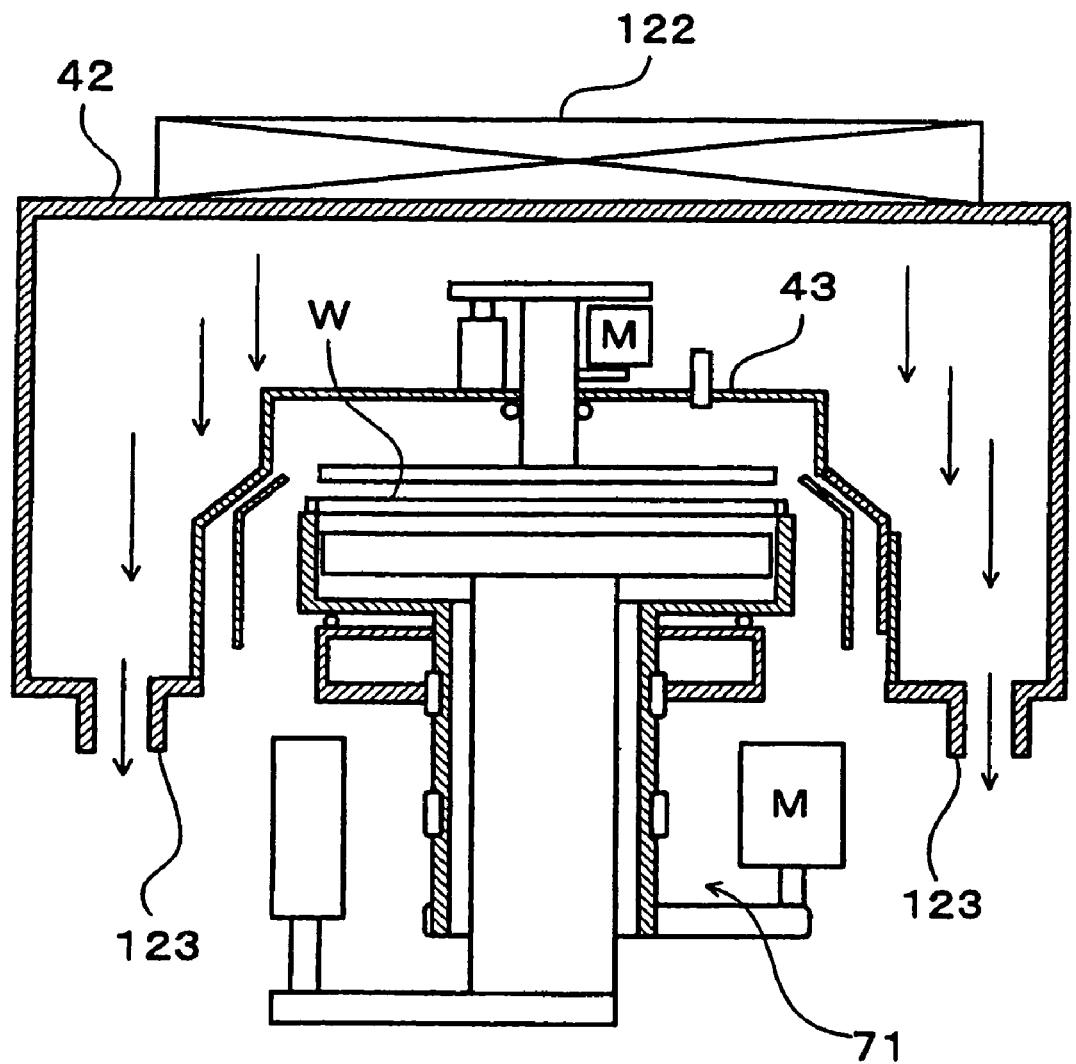
FIG. 18 is an explanatory view showing another top plate in the modification.

The above is one example of preferred embodiments in accordance with the present invention; nevertheless the invention is not limited to the above-mentioned embodiment only. For example, as shown in FIG. 18, the unit chamber 42 may be provided, on a top thereof, with a fan filter unit (FFU) 122 and also provided, on the lower part, with an exhaust mechanism 123. In this case, even if a processing liquid atmosphere in the outer chamber 43 leaks out, the atmosphere is discharged from the unit chamber 42 owing to the provision of downward flows produced by the FFU 122 and the exhaust mechanism 123. Therefore, there is not much likelihood that the wafer W is contaminated by the processing liquid atmosphere when unloading the processed wafer W. Additionally, there is not much likelihood that the processing liquid atmosphere leaks out of the unit chamber 42.

Figure 19:
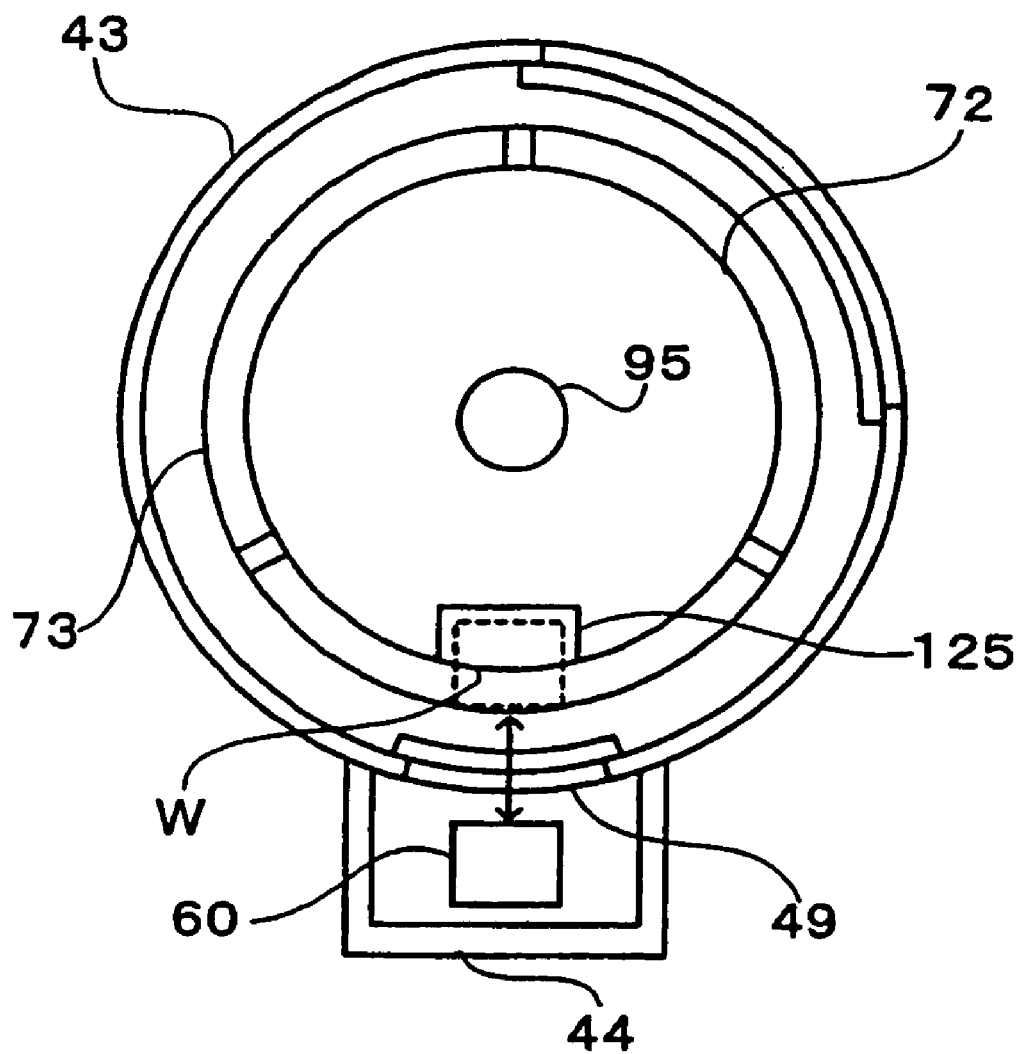
FIG. 19 is an explanatory view showing the substrate processing unit of the embodiment equipped with a fan filter unit (FFU) and an exhaust mechanism.

Further, as shown in FIG. 19, the top plate 72 may be provided with a recess 125. Then, if the processes of removing, rinsing and drying the peripheral part of the wafer W are performed while accommodating the edge arm 60 in the recess 125, the top plate 72 can cover all the faces of the wafer W except the wafer's faces during the supply of chemical liquid or pure water. Thus, even if the chemical liquid or the pure water scatters, it is possible to prevent the droplets of splash from adhering to the faces of the wafer W except the wafer's faces during the supply of chemical liquid or pure water.

During the process of removing the peripheral part of the wafer W, the pure-water nozzle 62 may supply pure water as the inert processing fluid in place of supplying $N_2$-gas through the $N_2$-gas nozzle 63. In this case, the pure water supplied onto the area 67 (FIG. 6) flows on the surface of the wafer W (the surface of the metallic film 141) while directing the periphery of the wafer W, providing the fan-shaped flowing area 67'. On the surface of the wafer W (the surface of the metallic film 141), the area 66 on the chemical supply and the flowing area 66' are together included in the area 67'. Additionally, the pure-water nozzle 62 begins the supply of pure water in advance of the supply of chemical liquid by the chemical nozzle 61. Therefore, there is no fear that the chemical liquid through the chemical nozzle 61 flows toward the center of the wafer W. Additionally, owing to the supply of $N_2$-gas through the upper supply path 106 of the top plate 72 lowered to the processing position, it is possible to prevent the chemical liquid and the pure water from flowing into the inside face of the wafer W effectively. Note, in order to make sure that the chemical liquid and the pure water are swept away by the pure water flowing in the form of the area 67', it is desirable that the area 67 of pure-water supply is wider than either of the area 66. That is, as shown in FIG. 6, it is carried out to supply the pure water in a manner that a width of the area 67' in the circumferential direction of the wafer W gets broader a width of the area 66'. Further, during the process of rinsing the peripheral part of the wafer W, the pure-water nozzle 62 may supply pure water as the inert processing fluid in place of supplying $N_2$-gas through the $N_2$-gas nozzle 63. Also in this case, owing to the supply of $N_2$-gas through the upper supply path 106 of the top plate 72 lowered to the processing position, it is possible to prevent the pure water from flowing into the inside face of the wafer W. Again, during the process of removing the peripheral part of the wafer W, the $N_2$-gas nozzle 63 may supply $N_2$-gas or the pure-water nozzle 62 may supply the pure water in place of supplying $N_2$-gas through the upper supply path 106 of the top plate 72. Also in this case, since either $N_2$-gas supplied through the $N_2$-gas nozzle 63 or pure water supplied through the pure-water nozzle 62 sweeps away the pure water while controlling the flow, it is possible to prevent the pure water from flowing into the inside face of the wafer W. Further, during the process of rinsing the peripheral part of the wafer W, the $N_2$-gas nozzle 63 and the pure-water nozzle 62 may supply $N_2$-gas and the pure water respectively in place of supplying $N_2$-gas through the upper supply path 106 of the top plate 72. Also in this case, since $N_2$-gas supplied through the $N_2$-gas nozzle 63 sweeps away the pure water while controlling the flow, it is possible to prevent the pure water from flowing into the inside face of the wafer W.

The edge arm 60 may be provided with the chemical nozzle 61 and the pure-water nozzle 62 except the $N_2$-gas nozzle 63. Also in this case, it is possible to prevent the chemical liquid, which has been supplied through the chemical nozzle 61 during the removal process of the peripheral part of the wafer W, from flowing into the inside face of the wafer W. Additionally, owing to the supply of $N_2$-gas through the upper supply path 106 of the top plate 72 during the rinsing process of the peripheral part of the wafer W, it is possible to prevent the pure water from flowing into the inside face of the wafer W. Alternatively, the edge arm 60 may be provided with the chemical nozzle 61 and the $N_2$-gas nozzle 63 except the pure-water nozzle 62.

The edge arm 60 may be constructed so as to be movable in the radial direction of the wafer W. Namely, the edge arm 60 may be moved while maintaining the relationship of FIG. 6 among the flows of the processing fluids. Then, it becomes possible to change a width of the wafer's face to be processed in the peripheral part of the wafer W. Additionally, it is possible to perform the processing for the wafer W with the chemical liquid in correspondence with a distance from the circumference of the wafer W in multistage. For example, as shown in FIG. 20, it is possible to eliminate the metallic film 141 so as to get thinner as approaching the periphery of the wafer W. Then, since either $N_2$-gas or pure water prevents progress of the chemical liquid flowing inside the wafer W, it is possible to move the edge arm 60 from the inside of the wafer W to the periphery. In this way, owing to the terraced formation of the corner of the metallic film 141, it can be peeled from the wafer W with difficulty. When the device structure has films formed in multi-layer (like the films 141*a*, 141*b*, 141*c* of FIG. 20), it is preferable to gradually narrow the width of each film to be eliminated from the periphery of the wafer W as the film is being lowered. Consequently, the metallic film 141 gets thinner as approaching the periphery of the wafer W.

The present invention is applicable to not only a substrate processing apparatus to which the cleaning liquid is supplied but also a substrate processing apparatus for the application of other treatments on the substrate besides both removal of the peripheral part of the substrate and cleaning thereof. Additionally, a substrate as the object to be processed is not limited to a semiconductor wafer only. Thus, the semiconductor may be replaced with the other substrate, for example, substrate for LCD glass, CD substrate, print base plate, ceramic substrate, etc.

According to the present invention, one processing fluid supplied from the inside fluid supplier can sweep away another processing fluid (for example, chemical liquid) supplied from the outside fluid supplier, in a direction apart from the center of the substrate. Therefore, it is possible to process the peripheral part of the substrate without processing the central portion of the substrate. Further, it is possible to change the width of the substrate's surface to be processed. Still, it is possible to prevent the processing fluid from splashing on the substrate's surface requiring no processing.

What is claimed is:

1. A substrate processing apparatus comprising:
   an annular substrate holder configured to hold a substrate, the substrate holder having a circumference;
   an annular top plate disposed above the substrate holder, and movable between a first position, where the top plate is located adjacent to an upper surface of the substrate held by the substrate holder, and a second position where the top plate is remote from the upper surface of the substrate held by the substrate holder; and
   a chemical liquid nozzle provided to discharge a chemical liquid onto a peripheral portion of the upper surface of the substrate held by the substrate holder; and
   wherein the top plate is provided with an inert gas supply path for supplying an inert gas to a space between the top plate and the substrate held by the substrate holder, the inert gas supply path has an open end serving as an inert gas supply port for supplying the inert gas into the space, and the open end is located in a center portion of the top plate so as to face a center portion of the upper surface of the substrate held by the substrate holder when the top plate is in the first position, wherein the top plate has a circumference sized so as to substantially cover the substrate holder when the top plate is in the first position and, wherein the top plate has an opening therein for accommodating the chemical liquid nozzle as the nozzle discharges the chemical liquid onto the peripheral portion of the substrate when the top plate is in the first position, and the opening is provided in a peripheral portion of the top plate so that a chemical liquid discharge port of the chemical liquid nozzle accommodated in the opening is located above the peripheral portion of the substrate to face the peripheral portion of the substrate when the top plate is in the first position.

2. The apparatus according to claim 1, wherein the chemical liquid nozzle is movable between a first position adjacent to the peripheral portion of the upper surface of the substrate held by the substrate holder, and a second position where the chemical liquid nozzle is withdrawn from a space above the upper surface of the substrate held by the substrate holder, the chemical liquid nozzle being in its first position when the top plate is in its first position, and the chemical liquid nozzle being in its second position when the top plate is in its second position.

3. The apparatus according to claim 1, further comprising an enclosure structure defining therein a closed space accommodating the chemical liquid nozzle and the top plate.

4. The apparatus according to claim 3, wherein an opening allowing the substrate to be loaded into and unloaded from the closed space defined in the enclosure structure is provided on the enclosure structure, and wherein a shutter for closing the opening is provided at the opening.

5. The apparatus according to claim 3, further comprising a $N_2$ gas supplier that supplies $N_2$ gas from an upper portion of the enclosure structure into the closed space.

6. The apparatus according to claim 1, further comprising a pure water nozzle that positions, as viewed from above, nearer to a center of the substrate held by the substrate holder than the chemical liquid nozzle, to supply pure water onto the upper surface of the substrate.

7. The apparatus according to claim 6, wherein the chemical liquid nozzle is inclined such that the chemical liquid jetted from the chemical liquid nozzle is directed toward outside the substrate held by the substrate holder.

8. The apparatus according to claim 6, further comprising an inert gas nozzle that positions, as viewed from above, nearer to a center of the substrate held by the substrate holder than the pure water nozzle, to supply inert gas onto the upper surface of the substrate.

9. The apparatus according to claim 1, further comprising a spin chuck having a chuck body and a plurality of holding members arranged at angular intervals which hold the peripheral part of the substrate.

* * * * *